United States Patent
Bretthauer et al.

(10) Patent No.: US 10,926,999 B2
(45) Date of Patent: Feb. 23, 2021

(54) MICROELECTROMECHANICAL TRANSDUCER

(71) Applicant: Infineon Technologies AG, Neubiberg (DE)

(72) Inventors: Christian Bretthauer, Munich (DE); Alfons Dehe, Villingen Schwenningen (DE); Alfred Sigi, Sinzing (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 16/540,625

(22) Filed: Aug. 14, 2019

(65) Prior Publication Data
US 2019/0367355 A1 Dec. 5, 2019

Related U.S. Application Data

(62) Division of application No. 16/031,722, filed on Jul. 10, 2018, now Pat. No. 10,626,007.

(30) Foreign Application Priority Data

Jul. 14, 2017 (DE) .................. 10 2017 115 923.1

(51) Int. Cl.
*H01L 41/18* (2006.01)
*B81B 3/00* (2006.01)
(Continued)

(52) U.S. Cl.
CPC ............. *B81B 3/0021* (2013.01); *B81B 3/00* (2013.01); *B81B 7/007* (2013.01); *B81B 7/008* (2013.01);
(Continued)

(58) Field of Classification Search
CPC .. B41J 2/14233; B41J 2/14209; B41J 2/1646; B41J 2/161; B41J 2/1642; B41J 2/1629;
(Continued)

(56) References Cited

U.S. PATENT DOCUMENTS

| 5,767,612 A | 6/1998 | Takeuchi et al. |
| 7,449,356 B2 | 11/2008 | Weigold |

(Continued)

FOREIGN PATENT DOCUMENTS

| JP | S48080289 A | 10/1973 |
| JP | S60160299 A | 8/1985 |
| JP | 2015100093 A | 5/2015 |

OTHER PUBLICATIONS

Littrell, Robert John, "High Performance Piezoelectric MEMS Microphones", Dissertation for the degree of Doctor of Philosophy, University of Michigan, Jun. 2010, 111 pages.
(Continued)

*Primary Examiner* — Dung A. Le
(74) *Attorney, Agent, or Firm* — Slater Matsil, LLP

(57) ABSTRACT

In accordance with an embodiment, a microelectromechanical transducer includes a displaceable membrane having an undulated section comprising at least one undulation trough and at least one undulation peak and a plurality of piezoelectric unit cells. At least one piezoelectric unit cell is provided in each case in at least one undulation trough and at least one undulation peak, where each piezoelectric unit cell has a piezoelectric layer and at least one electrode in electrical contact with the piezoelectric layer. The membrane may be formed as a planar component having a substantially larger extent in a first and a second spatial direction, which are orthogonal to one another, than in a third spatial direction, which is orthogonal to the first and the second spatial direction and defines an axial direction of the membrane.

27 Claims, 18 Drawing Sheets

(51) Int. Cl.
*H04R 19/00* (2006.01)
*H04R 17/02* (2006.01)
*H04R 19/02* (2006.01)
*H04R 19/04* (2006.01)
*B81B 7/02* (2006.01)
*B81C 1/00* (2006.01)
*H01L 41/113* (2006.01)
*B81B 7/00* (2006.01)
*H01L 41/09* (2006.01)
*H04R 7/06* (2006.01)
*H04R 31/00* (2006.01)
*H04R 7/04* (2006.01)

(52) U.S. Cl.
CPC ............ *B81B 7/02* (2013.01); *B81C 1/00182* (2013.01); *B81C 1/00626* (2013.01); *H01L 41/09* (2013.01); *H01L 41/0973* (2013.01); *H01L 41/1132* (2013.01); *H01L 41/1138* (2013.01); *H01L 41/18* (2013.01); *H04R 7/06* (2013.01); *H04R 17/02* (2013.01); *H04R 19/005* (2013.01); *H04R 19/02* (2013.01); *H04R 19/04* (2013.01); *B81B 2201/0235* (2013.01); *B81B 2201/0257* (2013.01); *B81B 2201/0264* (2013.01); *B81B 2201/032* (2013.01); *B81B 2203/0127* (2013.01); *B81B 2203/04* (2013.01); *H01L 2924/1461* (2013.01); *H04R 7/045* (2013.01); *H04R 31/00* (2013.01); *H04R 31/003* (2013.01); *H04R 2201/003* (2013.01); *H04R 2217/01* (2013.01)

(58) Field of Classification Search
CPC ..... B41J 2/1632; B41J 2/1609; H01L 41/098; H01L 41/331; H01L 41/053; H01L 29/06
See application file for complete search history.

(56) References Cited

U.S. PATENT DOCUMENTS

| | | |
|---|---|---|
| 2007/0184624 A1 | 8/2007 | Mueller et al. |
| 2010/0072561 A1 | 3/2010 | Lee et al. |
| 2011/0061215 A1 | 3/2011 | Defay et al. |
| 2011/0064250 A1 | 3/2011 | Jeong et al. |
| 2012/0248063 A1* | 10/2012 | De Brabander ...... B81B 3/0021 216/36 |
| 2012/0252221 A1* | 10/2012 | De Brabander .... B81C 1/00103 438/736 |
| 2012/0262029 A1* | 10/2012 | De Brabander ..... B41J 2/14233 310/328 |
| 2012/0319418 A1 | 12/2012 | Nishiwaki |
| 2015/0021722 A1 | 1/2015 | Dehe et al. |
| 2015/0041930 A1 | 2/2015 | Kim et al. |
| 2017/0017019 A1 | 1/2017 | Bolis |
| 2017/0142525 A1 | 5/2017 | Glacer et al. |
| 2018/0035229 A1 | 2/2018 | Deas et al. |
| 2018/0220240 A1 | 8/2018 | Yoo |
| 2019/0160491 A1 | 5/2019 | Biateau et al. |

OTHER PUBLICATIONS

Yan, Hai et al., "Corrugated Diaphragm for Piezoelectric Microphone", IEEE Proceedings Conference on Emerging Technologies and Factory Automation, ETFA '96, Nov. 18-21, 1996, 155 pages, DOI: 10.1109/ETFA. 1996.573901.

Yen, Ting-Ta et al., "Corrugated aluminum nitride energy harvesters for high-energy conversion effectiveness", J. Micromech. Microeng., vol. 21, Jul. 26, 2011, 9 pages, doi:10.1088/0960-1317/21/8/085037.

* cited by examiner

MICROELECTROMECHANICAL TRANSDUCER

This application is a divisional of U.S. patent application Ser. No. 16/031,722, filed Jul. 10, 2018, which application claims the benefit of German Application No. 102017115923.1, filed on Jul. 14, 2017, which applications are hereby incorporated herein by reference in their entireties.

TECHNICAL FIELD

Different embodiments generally relate to a microelectromechanical transducer and to a method for producing a microelectromechanical transducer.

BACKGROUND

Microelectromechanical transducers play a central role in modern electronics both as sensors and also as actuators and are used in a multiplicity of different applications, for example as microphones, loudspeakers, pressure sensors or acceleration sensors.

Microelectromechanical transducers can have a membrane, which can be displaced in a passive or active manner depending on whether the transducers are formed as sensors or actuators. In the case of a microelectromechanical transducer formed as a sensor, the membrane can be displaceable in a passive manner, for example by sound to be detected or an acceleration to be detected. Characteristics of the variable to be detected, such as a sound frequency, a sound amplitude or a temporal acceleration profile, can be ascertained from a displacement of the membrane. In the case of a microelectromechanical transducer formed as an actuator, the membrane can be displaced in an active manner, for example in order to generate sound in a loudspeaker.

Such membranes of microelectromechanical transducers can be formed at least in sections from a piezoelectric material, in which, in the case of a passive displacement of the membrane, a voltage is induced, which can be read out by a suitable read-out circuit in order to ascertain characteristics of a variable to be detected. Alternatively, in the case of an actuator, a voltage can be applied to the membrane in order to bring about a targeted deformation of the membrane, for example in order to generate sound.

SUMMARY

According to various embodiments, a method for producing a microelectromechanical transducer can comprise: forming a negative mold for the membrane, which mold has a side comprising at least one undulation peak and at least one undulation trough, which side is complementary to a side of the membrane, forming the membrane on the side of the negative mold which has at least one undulation peak and at least one undulation trough, and forming a piezoelectric unit cell at least one undulation peak of the membrane and a piezoelectric unit cell in at least one undulation trough of the membrane.

BRIEF DESCRIPTION OF THE DRAWINGS

Various embodiments will be described below with reference to the appended drawings, in which.

DETAILED DESCRIPTION OF ILLUSTRATIVE EMBODIMENTS

Figure 1:
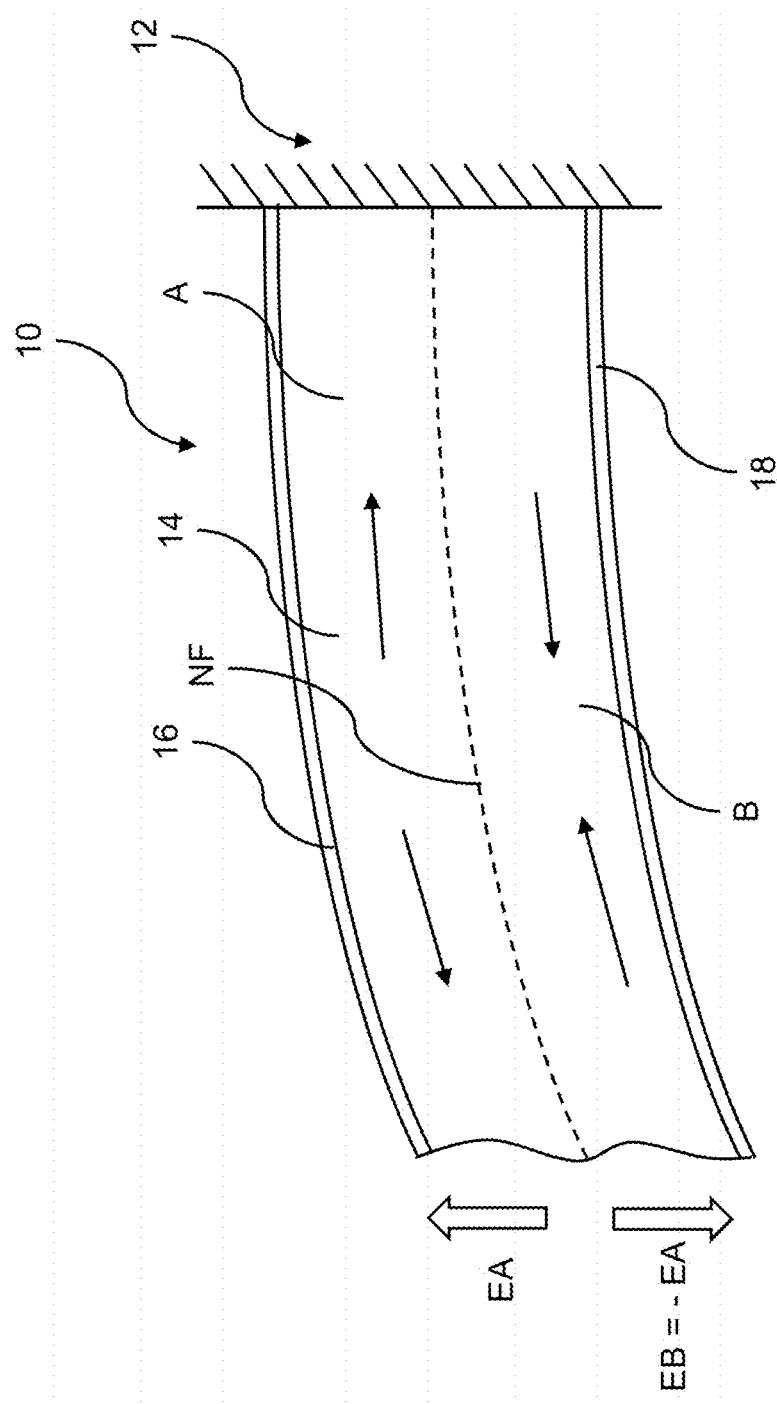
FIG. 1 is a view of a section of a conventional piezoelectric membrane.

The term "exemplary" is used here to mean "as an example, serving as an exemplar or for illustration". Each embodiment or configuration described here as "exemplary" is not necessarily to be understood as being preferred or advantageous compared to other embodiments or configurations.

In the drawings, identical reference signs relate to the same parts in the different views. The drawings serve primarily to illustrate the essential principles of the present disclosure and are therefore not necessarily true to scale.

In piezoelectric membranes, which are used in conventional microelectromechanical transducers, there is generally the problem that either no defined deformation can be brought about by applying a voltage to the membrane or that the sensitivities that can be achieved using such microelectromechanical sensors are very low on account of internal electrical shorts in a piezoelectric membrane. This will be explained below with reference to FIG. 1.

FIG. 1 shows a section of a conventional piezoelectric membrane 10 used in a microelectromechanical transducer, which piezoelectric membrane is secured at an end 12 and, as indicated by the curved design, can be displaced by a physical variable to be detected, for example by sound. The membrane 10 has a piezoelectric layer 14 and, on opposite sides of the piezoelectric layer 14, electrodes 16, 18 for tapping a voltage induced in the piezoelectric layer 14. In FIG. 1, the neutral fiber NF of the membrane 10 is illustrated using dashes. The neutral fiber NF is that plane of the membrane 10 whose length does not change in the case of a displacement of the membrane 10. In this plane, a displacement of the membrane 10 consequently does not lead to tensile or pressure loading.

As indicated in FIG. 1, the neutral fiber NF divides the membrane 10 into two regions, a region A (at the top in FIG. 1), which, as indicated by the arrows in this region, is subjected to tensile loading in the case of the displacement of the membrane 10 shown in FIG. 1, and a region B (at the bottom in FIG. 1), which, as indicated by the arrows in this region, is subjected to pressure loading in the case of the displacement of the membrane 10 shown in FIG. 1. On account of the different loading in the regions A and B, the electrical fields EA and EB, which are induced in these regions by a deflection of the membrane 10, have opposite signs, with the result that the net voltage that can be tapped by means of the electrodes 16, 18 is very low, as a result of which the sensitivity that can be achieved is limited to a considerable extent. A defined deformation of the membrane 10 likewise cannot be brought about by applying a voltage to the electrodes 16, 18.

In addition, in the production of microelectromechanical transducers, there is generally essentially a significant challenge in producing the membranes of said microelectromechanical transducers with well-defined designs in order to be able to ensure reproducible behavior. This also applies to microelectromechanical transducers with piezoelectric membranes. A significant problem results in this case from mechanical stresses to which such membranes are subjected and which can adversely affect reproducible behavior. These mechanical stresses can have intrinsic causes and can be attributed to thermal or mechanical loadings during the production process. Alternatively or in addition, such mechanical stresses can be attributed to mutually differing coefficients of thermal expansion of different components of a microelectromechanical transducer, which can be transmitted to the membrane.

Accordingly, some embodiment microelectromechanical transducers are configured to have well-defined electrical and mechanical properties.

Figure 2:
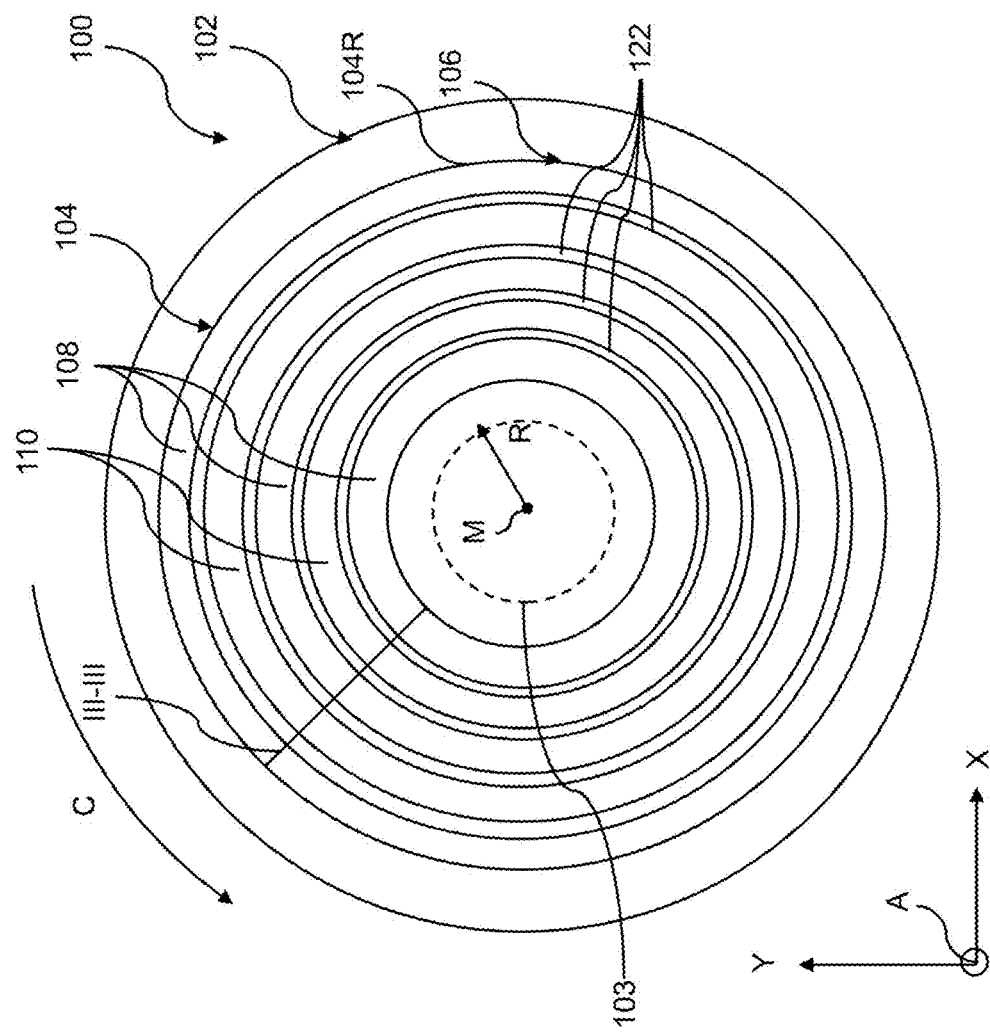
FIG. 2 is a plan view of a piezoelectric membrane of a microelectromechanical transducer according to an exemplary embodiment.

FIG. 2 illustrates an exemplary microelectromechanical transducer 100. Said microelectromechanical transducer can have a holder 102 and a displaceable membrane 104 secured to the holder 102. At least a part of the membrane 104 can be formed from piezoelectric material. A voltage, which can be measured by a suitable read-out circuit, can be induced in the piezoelectric material by a displacement of the membrane 104. Characteristics of a variable to be detected, such as, for example, sound to be detected or an acceleration to be detected, can be ascertained from the measured voltage. Alternatively, a voltage can be applied to the membrane 104 in order to displace the membrane 104, for example in order to generate sound.

If the transducer boo is formed as an acceleration sensor or as part of an acceleration sensor, an inertial mass 103 can be provided on the membrane 104, for example on a central section of the membrane 104, in order to increase a force exerted on the membrane 104 by an acceleration to be detected. The inertial mass 103 can be formed separately from the membrane 104. Said inertial mass can be formed, for example, from a semiconductor material, such as silicon.

As indicated in FIG. 2, the membrane 104 can be secured at its edge region 104R in a circumferential manner to the holder 102. The membrane 104 can be formed as a closed component so that an interruption-free connection exists along the membrane 104 between two arbitrary points of the edge region 104R of the membrane 104. The membrane 104 can consequently be formed in a manner free of fluid passage openings, which can otherwise act as a source of noise when fluid such as, for example, a gas flows through such a fluid passage opening. The lack of a fluid passage opening in the membrane 104 can constitute a considerable advantage over a piezoelectric membrane that has a plurality of cantilevers, which can be deflected independently of one another. A closed membrane 104 is also particularly robust, since any cantilevers react in a particularly sensitive manner to extreme mechanical loadings, which can lead to damage of a membrane having cantilevers, for example in the event of an impact. However, this does not exclude a membrane 104 described here from being able to have one or more openings in order to minimize a resistance, which can be caused by gas, for example air, collected on a side of the membrane 104. This can ensure a high degree of resilience of the membrane 104.

The membrane 104 shown in FIG. 2 can be formed as a planar component. "Planar" here essentially means that the membrane 104 has a substantially greater extent along a first spatial direction X and a second spatial direction Y orthogonal to the first spatial direction X than along a third spatial direction, which is orthogonal to the first spatial direction X and to the second spatial direction Y and defines an axial direction A of the membrane 104.

The membrane 104 can have an undulated section 106 comprising at least one undulation peak 108 and at least one undulation trough no or comprising a plurality of undulation peaks 108 and a plurality of undulation troughs no. The undulation peaks 108 and the undulation troughs no are arranged consecutively in a radial direction R of the membrane 104 in alternating fashion. The undulation peaks 108 or/and the undulation troughs no can have a circular or circular-segment-shaped design and be arranged concentrically, for example around a center point M of the membrane 104. A circular-segment-shaped configuration of the undulation peaks 108 and undulation troughs no (not shown) permits, for example, a radial laying of feed lines on the membrane 104.

Due to a circular or circular-segment-shaped formation of the undulation peaks 108 or/and undulation troughs no, the membrane 104 is primarily set up to detect a deflection in the circumferential direction C.

The mechanical stresses discussed at the beginning can be compensated for by the provision of the undulated section 106 since the undulated section 106 can function as an elastic element, which can absorb the mechanical stresses discussed at the beginning by extension or compression, as a result of which a deformation of the membrane 104 caused by the mechanical stresses can be limited. This can ensure that the membrane 104 has a well-defined design and is consequently deflected in a well-defined manner, as a result of which reproducible behavior can be achieved.

Furthermore, the undulated section 106 of the membrane 104 can be utilized to reduce or to eliminate the compensation of induced electrical fields discussed at the beginning. This is explained below with reference to FIG. 3, which shows a section through the membrane 104 along the line III-III shown in FIG. 2.

Figure 3:
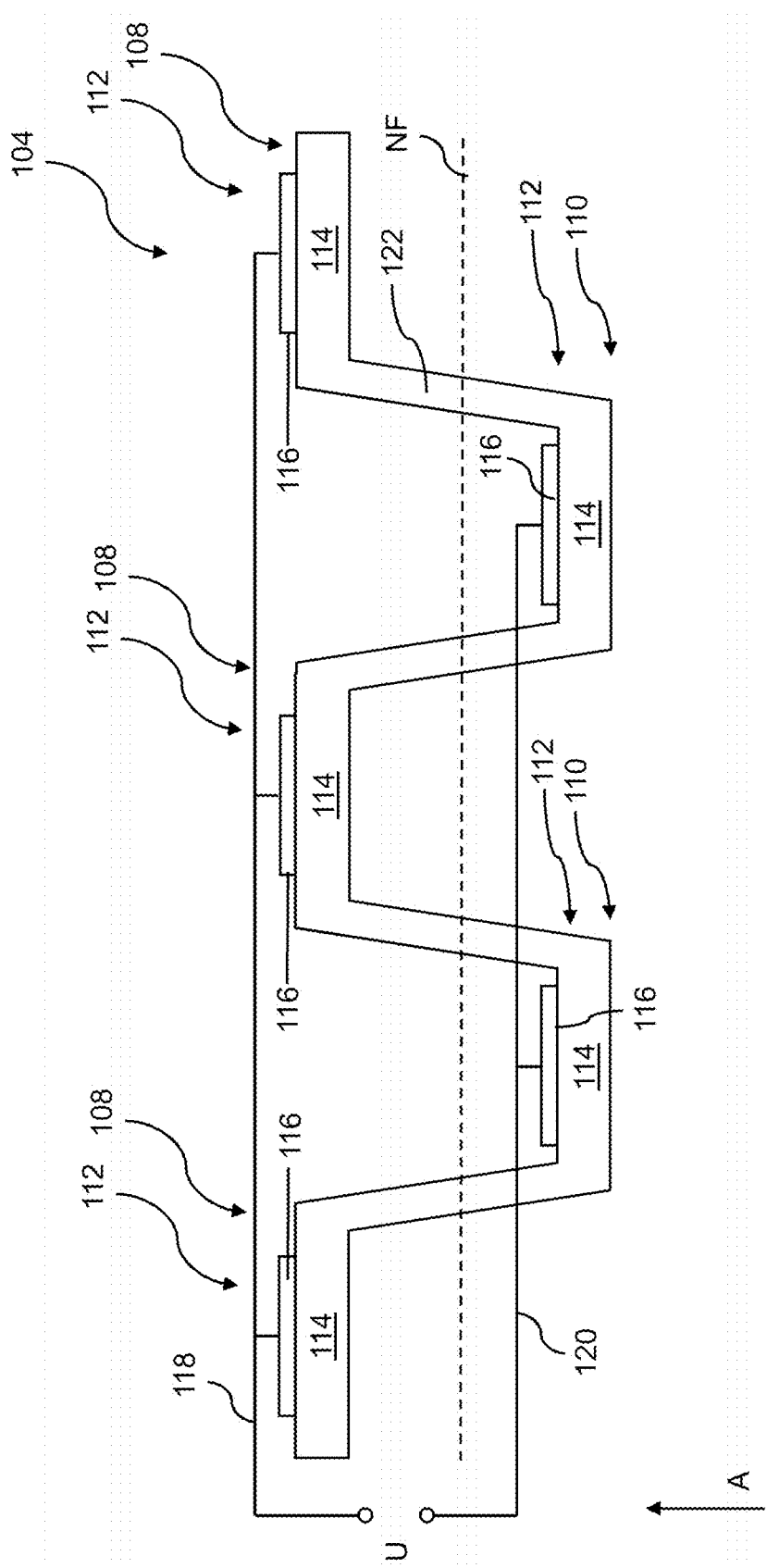
FIGS. 3 to 7 are sectional views of a section of piezoelectric membranes of microelectromechanical transducers according to various embodiments.

As shown in FIG. 3, a piezoelectric unit cell 112 can be provided in each case at a plurality of undulation peaks 108 or/and in a plurality of undulation troughs no or even at each undulation peak 108 or/and in each undulation trough no, which piezoelectric unit cell has a piezoelectric layer 114 and at least one electrode 116 in electrical contact with the piezoelectric layer 114. In the undulated section 106, the neutral fiber NF of the membrane 104 is located in the axial direction A between the undulation peaks 108 and the undulation troughs no. As a result of this, the membrane 104 is divided in the axial direction A by the neutral fiber NF into two regions, which, in the event of a deflection of the membrane 104, are subjected either to tensile loading or pressure loading. It is thus possible, for example, in the case of a deflection of the membrane 104, for the undulation peaks 108 to be subjected exclusively to tensile loading while the undulation troughs no can be subjected exclusively to pressure loading, and vice versa. This has the result that an electrical field with a consistent sign is induced in an undulation peak 108 or an undulation trough no, so that, in contrast to the conventional piezoelectric membranes discussed at the beginning, no compensation of the electrical field within a piezoelectric layer 114 occurs, which would limit the net voltage that can be tapped. As a result of this, in the case of a prescribed deflection of the membrane 104, a voltage U that is higher compared to conventional piezoelectric transducers can ultimately be tapped, which makes a higher sensitivity compared to conventional microelectromechanical transducers possible. Furthermore, a defined deflection of the membrane 104 can be achieved by applying a voltage to the respective electrodes 116.

The piezoelectric unit cells 112 shown in FIG. 3 can have just one single electrode 116, which can be provided on the same side of the respective piezoelectric layers 114. This configuration can make the production of the microelectromechanical transducer 100 particularly simple since the electrodes 116 can be vapor-deposited or/and structured at the same time.

Basically any electrically conductive material is possible as the material for the electrodes 116, for example a metal, such as aluminum. The piezoelectric layers 114 of the respective piezoelectric unit cells 112 can be produced, for example, from aluminum nitride (AlN), zinc oxide (ZnO) or lead zirconate titanate (PZT).

As indicated in FIG. 3, the electrodes 116 of the piezoelectric unit cells 112 provided at the undulation peaks 108 can be electrically connected in parallel with one another by a line 118, while the electrodes 116 of the piezoelectric unit cells 112 provided in the undulation troughs no can be electrically connected in parallel with one another by a line 120. As a result of this, the electrical potentials induced in the respective piezoelectric unit cells 112 at the undulation peaks 108 or in the undulation troughs no can be tapped by means of the respective electrodes 116 and subsequently summed, as a result of which a high net voltage U can be tapped.

The piezoelectric layers 114 of the respective piezoelectric unit cells 112 can be formed integrally with one another. As shown in FIGS. 2 and 3, the piezoelectric layers 114 of two adjacent piezoelectric unit cells 112 can be connected integrally to one another by connecting sections 122, which extend substantially in the axial direction A. Due to the integral formation of the piezoelectric layers 114, the membrane 104 can be produced in a simple manner overall, since, at the same time as the production of the undulated section 106, the piezoelectric layers 114 of the piezoelectric unit cells 112 can also be produced.

A further exemplary embodiment will be described below with reference to FIG. 4. In this case, identical components or component sections to FIG. 3 will be provided with the same reference signs as in FIG. 3, which have, however, been increased by the number 100 compared to FIG. 3. For the sake of simplicity, the description of the embodiment shown in FIG. 4 deals only with differences to the embodiment shown in FIG. 3, to the description of which reference is otherwise expressly made.

Figure 4:
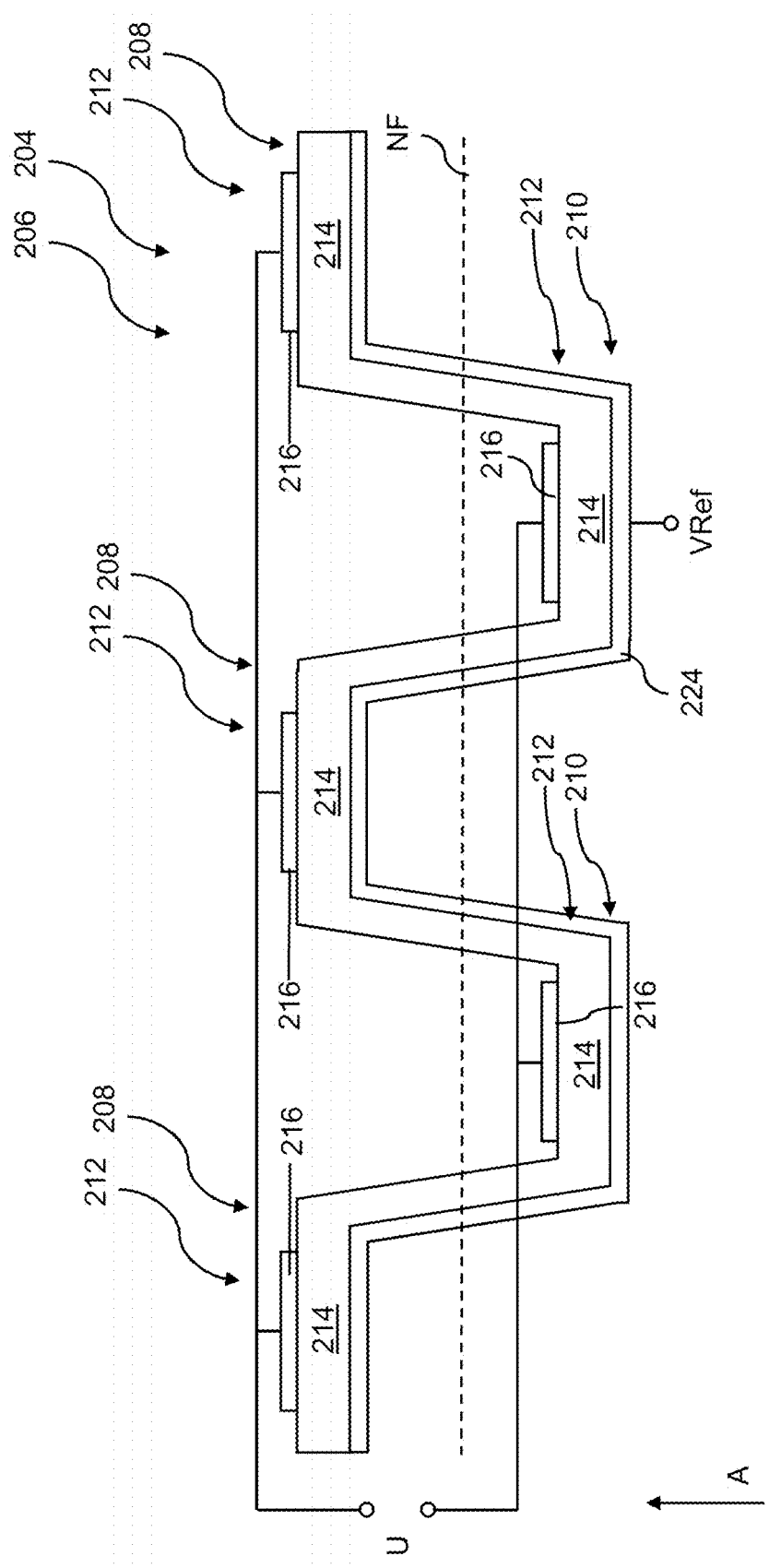

The membrane 204 shown in FIG. 4 differs from the membrane 104 shown in FIG. 3 only in that it has a continuous electrically conductive layer 224, which can be formed, for example, from a metal, on a side of the piezoelectric layer 214 opposite the electrodes 216 of the piezoelectric unit cells 212. The electrically conductive layer 224 can ensure, for example, a defined field profile of an electrical field induced in a piezoelectric unit cell 212. In addition, the electrically conductive layer 224 can serve as reference electrode in order to provide a reference potential VRef for the piezoelectric unit cells 212 both at the undulation peaks 208 and in the undulation troughs 210. As a result of this, in the case of a sensor, for example a microphone, a differential detection scheme can be realized, in which the voltage induced in the piezoelectric unit cells 212 at the undulation peaks 208 and the voltage induced in the piezoelectric unit cells 212 in the undulation troughs 210 can be subtracted from one another in order to eliminate common noise contributions. As a result of this, a high sensitivity can ultimately be achieved.

Each piezoelectric unit cell 212 in FIG. 4 consequently has an electrode 216, 224 in each case on opposite sides of its piezoelectric layer 214. The electrodes 216 on a first side of the piezoelectric layers 214 are formed separately from one another whereas the electrodes 224 on a second side of the piezoelectric layers 214 that is opposite the first side are formed integrally with one another. The undulated section 206 of the membrane 204 shown in FIG. 4 consequently has a layered structure, which has the electrically conductive layer 224 as one layer and the piezoelectric layer 214 as a further layer.

A further exemplary embodiment will be described below with reference to FIG. 5. In this case, identical components or component sections to FIG. 3 are provided with the same reference signs as in FIG. 3, which have, however, been increased by the number 200 compared to FIG. 3. For the sake of simplicity, the description of the embodiment shown in FIG. 5 deals only with differences to the embodiment shown in FIG. 3, to the description of which reference is otherwise expressly made.

Figure 5:
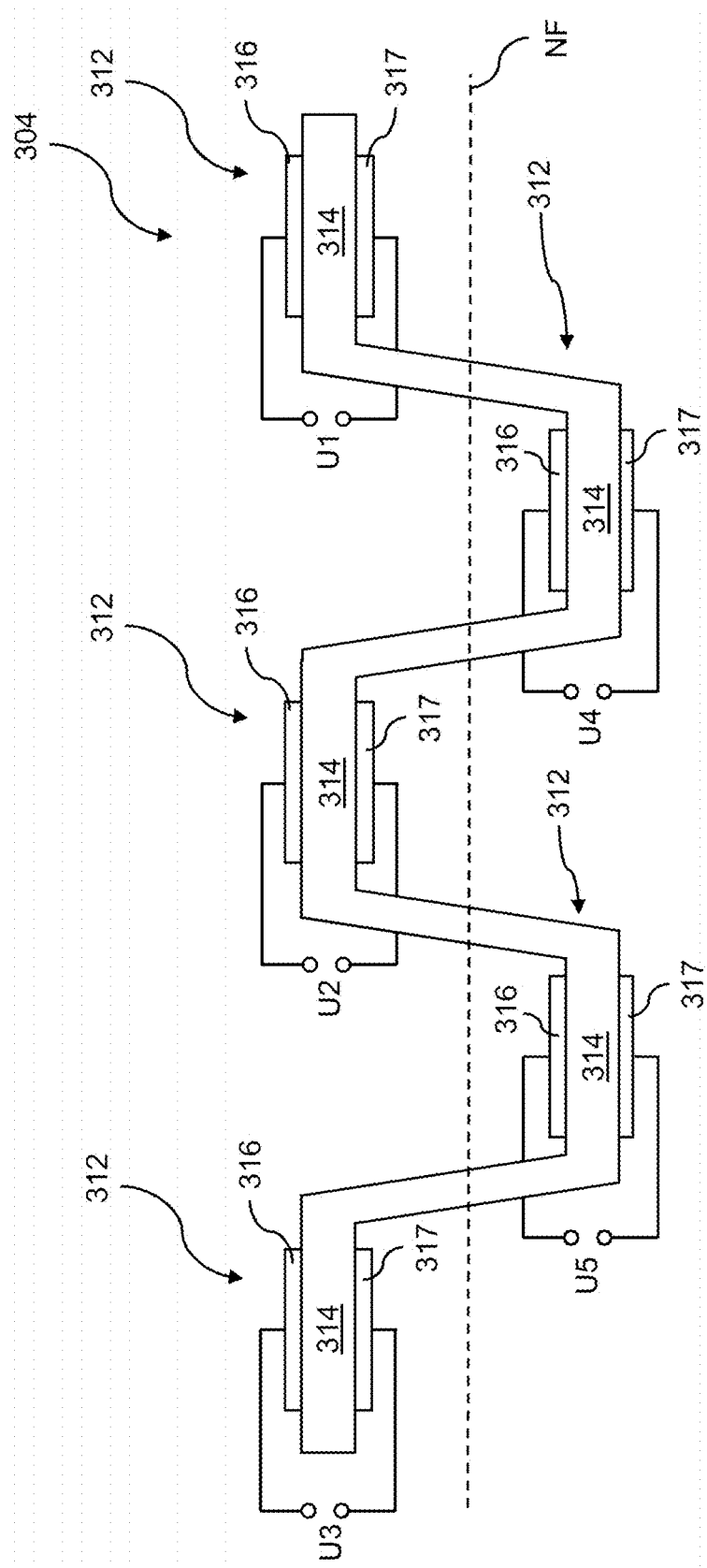

In the membrane 304 shown in FIG. 5, one or more piezoelectric unit cells 312 or even each piezoelectric unit cell 312 can have two electrodes 316, 317, which in each case are in electrical contact with the associated piezoelectric layer 314, wherein the electrodes 316, 317 of a piezoelectric unit cell 312 are formed separately from the electrodes 316, 317 of each other piezoelectric unit cell 312. The electrodes 316, 317 of a piezoelectric unit cell 312 are arranged on opposite sides of a piezoelectric layer 314. Due to this configuration, it is possible to ensure a defined profile of an electrical field induced in a piezoelectric unit cell 312. A voltage U1-U5 induced in a specific piezoelectric unit cell 312 can be tapped locally, as shown in FIG. 5. In the membrane 304 shown in FIG. 5, there is consequently a plurality of independent voltage sources, which can be electrically connected in series with one another in order to be able to tap a high output voltage. As a result of this, for example in the case of a sensor, a high detection sensitivity can be achieved.

The tapping of the induced voltage according to FIG. 5 consequently offers an alternative to the diagram shown in FIGS. 3 and 4 in which the electrodes at the undulation peaks are electrically connected in parallel and the electrodes in the undulation troughs are electrically connected in parallel. As a result of this, alternatives that can be selected individually depending on a downstream read-out circuit, such as an amplifier, are thus provided, in order to be able to provide, for example, capacitive matching or impedance matching.

A further exemplary embodiment will be described below with reference to FIG. 6. In this case, identical components or component sections to FIG. 3 are provided with the same reference signs as in FIG. 3, which have, however, been increased by the number 300 compared to FIG. 3. For the sake of simplicity, the description of the embodiment shown in FIG. 6 deals only with differences to the embodiment shown in FIG. 3, to the description of which reference is otherwise expressly made.

Figure 6:
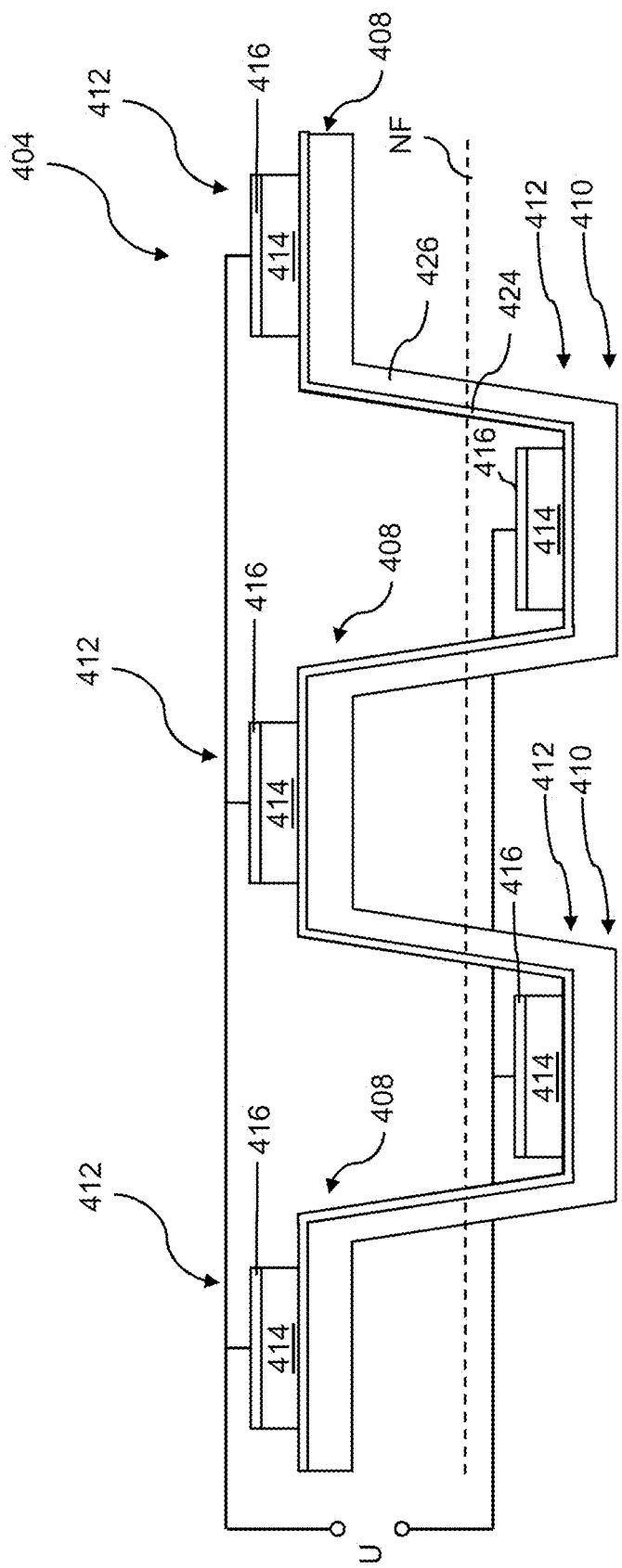

The membrane 404 shown in FIG. 6 differs from the membrane 104 according to FIG. 3 in that the plurality of piezoelectric unit cells 412 do not have a common piezoelectric layer but instead have mutually different piezoelectric layers 414, which are in electrical contact with a respective electrode 416. In contrast to the membrane 104 shown in FIG. 3, the membrane 404 has a carrier 426 different from the piezoelectric layers 414, said carrier being able to be formed from a non-piezoelectric material, such as from a semiconductor material, for example silicon. The carrier 426 has an undulated design and as a result defines a plurality of undulation peaks 408 and a plurality of undulation troughs 410.

Thanks to the carrier 426 formed from a non-piezoelectric material, the membrane 404 can be produced with a well-defined design since the undulation shape of the undulated section of the membrane 404 can be produced in some circumstances in a more precise manner from a non-piezoelectric material than from a piezoelectric material since the growth of piezoelectric materials often has great directional dependency.

The carrier 426 formed from a non-piezoelectric material also makes it possible to electrically decouple the plurality of piezoelectric unit cells 412, which electrical decoupling prevents crosstalk and compensation, which may be caused as a result of said crosstalk, of electrical fields induced in different piezoelectric unit cells 412. As a result, it is possible to ensure a defined behavior of the membrane 404.

As shown in FIG. 6, the membrane 404 can be provided with an integral electrode 424 on the side of the carrier 426 that faces the piezoelectric unit cells 412, said electrode, as mentioned above, being able to make a differential detection scheme possible, for example as common electrode.

A further exemplary embodiment will be described below with reference to FIG. 7. In this case, identical components or component sections to FIG. 6 are provided with the same reference signs as in FIG. 6, which have, however, been increased by the number 100 compared to FIG. 6. For the sake of simplicity, the description of the embodiment shown in FIG. 7 deals only with differences to the embodiment shown in FIG. 6, to the description of which reference is otherwise expressly made.

Figure 7:
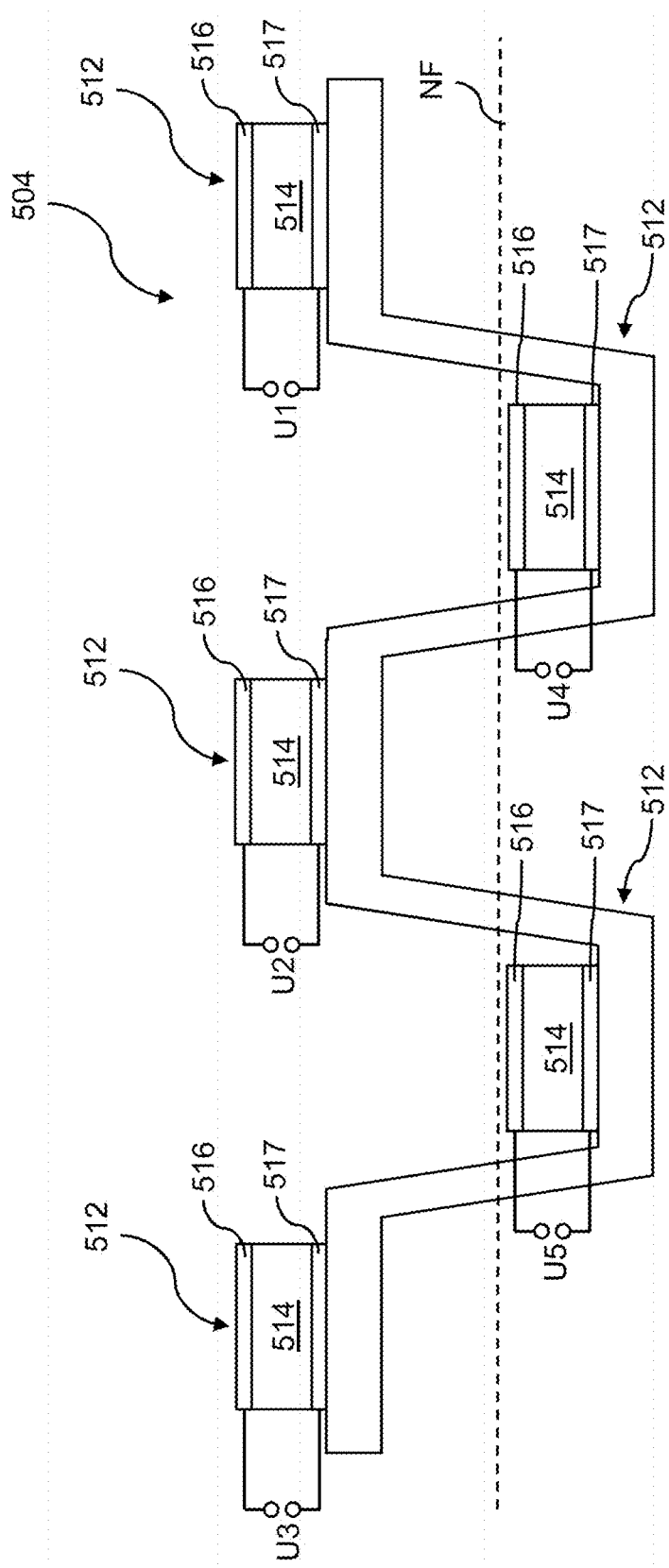

The membrane 504 shown in FIG. 7 differs from the membrane 404 according to FIG. 6 in that at least one piezoelectric unit cell 512, a plurality of piezoelectric unit cells 512 or even each piezoelectric unit cell 512 has two electrodes 516, 517, which are provided on opposite sides of the respective piezoelectric layers 514 and are formed in each case separately from the electrodes 516, 517 of each other piezoelectric unit cell 512. As a result of this, the voltages U1-U5 induced in the respective piezoelectric unit cells 512 can be read out locally, like in the embodiment shown in FIG. 5. Reference is otherwise made to the description of the embodiment shown in FIG. 5.

A further exemplary embodiment will be described below with reference to FIG. 8. In this case, identical components or component sections to FIG. 2 are provided with the same reference signs as in FIG. 2, which have, however, been increased by the number 500 compared to FIG. 2. The transducer shown in FIG. 8 is described only to the extent that it differs from the transducer shown in FIG. 2, to the description of which reference is otherwise expressly made.

Figure 8:
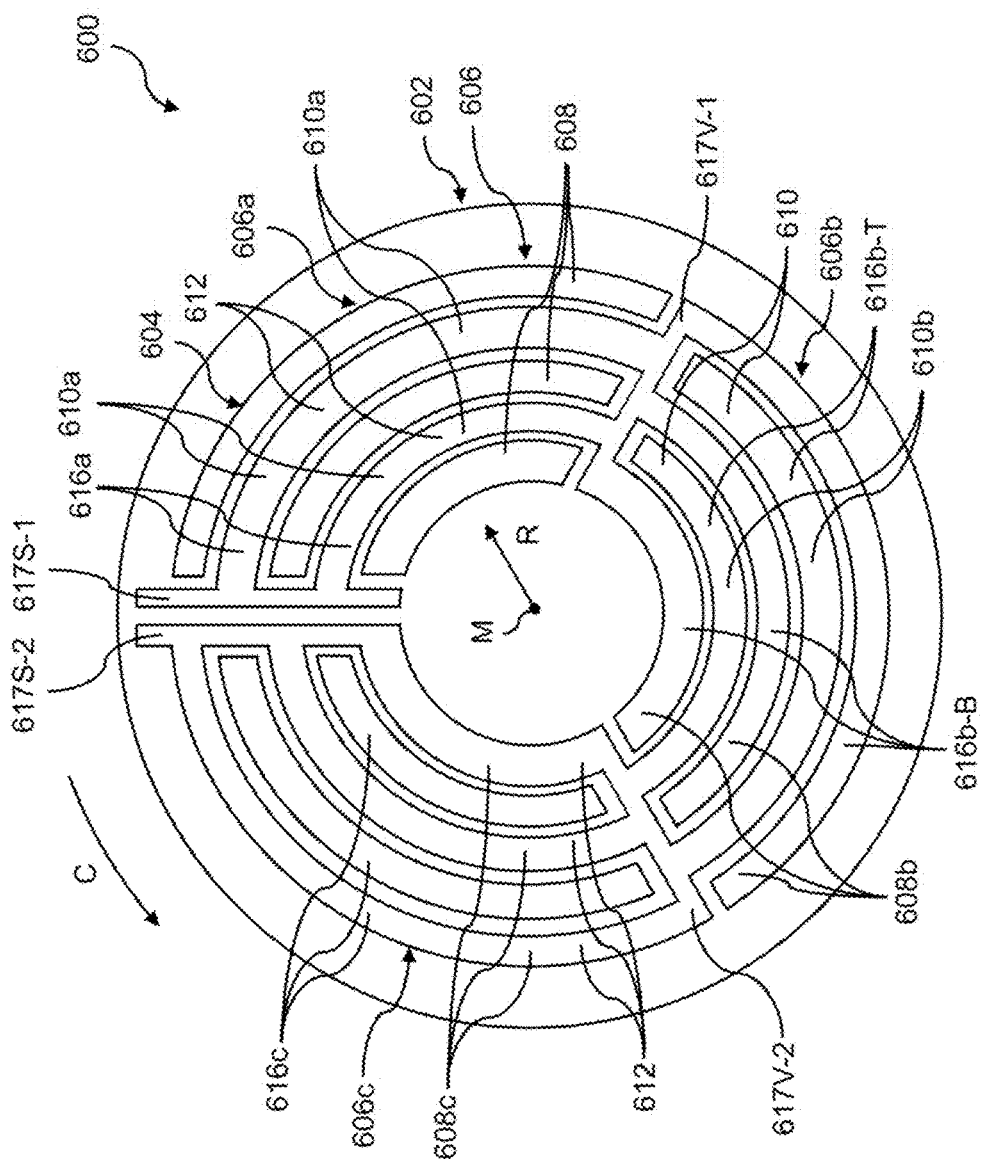
FIG. 8 is a view of a front side of a piezoelectric membrane of an exemplary microelectromechanical transducer.

The transducer 600 shown in FIG. 8 has a membrane 604 comprising an undulated section 606, which membrane is borne on a holder 602. The undulated section 606 has a plurality of undulation peaks 608 and a plurality of undulation troughs 610. Said undulation peaks and troughs can be arranged, as indicated in FIG. 8, consecutively in a radial direction R of the membrane 604 in alternating fashion. A piezoelectric unit cell 612 can be provided at each undulation peak 608 and in each undulation trough, which piezoelectric unit cells in each case have an electrode provided on one side of the membrane 604.

As likewise shown in FIG. 8, the undulated section 606 can be segmented in a circumferential direction C of the membrane 604 into a plurality of circumferential sections 606a-c, for example into a first, a second and a third circumferential section 606a, 606b, 606c. The piezoelectric unit cells 612 provided at the undulation peaks 608 and in the undulation troughs 610 and the associated electrodes can accordingly also be segmented in the circumferential direction C. A plurality of electrodes provided at respective undulation peaks 608 can be electrically connected in parallel with one another in a circumferential section 606a-c of the undulated section 606. Alternatively or in addition, a plurality of electrodes provided in respective undulation troughs 610 can be electrically connected in parallel with one another in a circumferential section 606a-c of the undulated section 606.

As shown in FIG. 8, the electrodes 616a provided in the undulation troughs 610a of the first circumferential section 606a of the undulated section 606 can be electrically connected to one another in parallel at an end in the circumferential direction C by a first busbar 617S-1 and at an opposite end in the circumferential direction C by a first connecting rail 617V-1. The first busbar 617S-1 can be formed as a bar that extends in the radial direction R and that is arranged between the first and the third circumferential section 606a, 606c of the undulated section 606.

The first connecting rail 617V-1 simultaneously connects the electrodes 616b-B provided at the undulation peaks 608b in the second circumferential section 606b of the undulated section 606 electrically in parallel with one another and simultaneously electrically in series with the electrodes 616a in the undulation troughs 610a, which electrodes are electrically connected in parallel in the first circumferential section 606a of the undulated section 606.

The electrodes 616b-T provided in the undulation troughs 610b of the second circumferential section 606b of the undulated section 606 can be connected to one another in parallel by means of a second connecting rail 617V-2, which is located in the circumferential direction C between the second and third circumferential sections 606b, 606c of the undulated section 606 and extends in the radial direction R.

The second connecting rail 617V-2 simultaneously connects the electrodes 616c provided at the undulation peaks 608c in the third circumferential section 606c of the undulated section 606, electrically in parallel with one another, at an end section in the circumferential direction C. The second connecting rail 617V-2 consequently provides an electrical series circuit between the electrodes 616b-T in the undulation troughs 610b, which electrodes are connected in parallel in the second circumferential section 606b, and the electrodes 616c at the undulation peaks 608c, which electrodes are connected in parallel in the third circumferential section 606c.

An end of the electrodes 616c connected in parallel in the third circumferential section 606c of the undulated section 606, which end is opposite the second connecting rail 617V-2 in the circumferential direction C, is electrically connected to a second busbar 617S-2. A total voltage at the membrane 604 can be tapped by means of the first and the second busbar 617S-1, 617S-2.

The configuration shown in FIG. 8 provides, for example, a simple and compact option for maximizing a voltage that can be generated in the membrane 604 by a deflection. This configuration can likewise be used to bring about a defined deflection of the membrane 604 by applying a voltage to the busbars 617S-1 and 617S-2 if the microelectromechanical transducer 600 shown in FIG. 8 is formed as an actuator or as part of an actuator.

Figure 9:
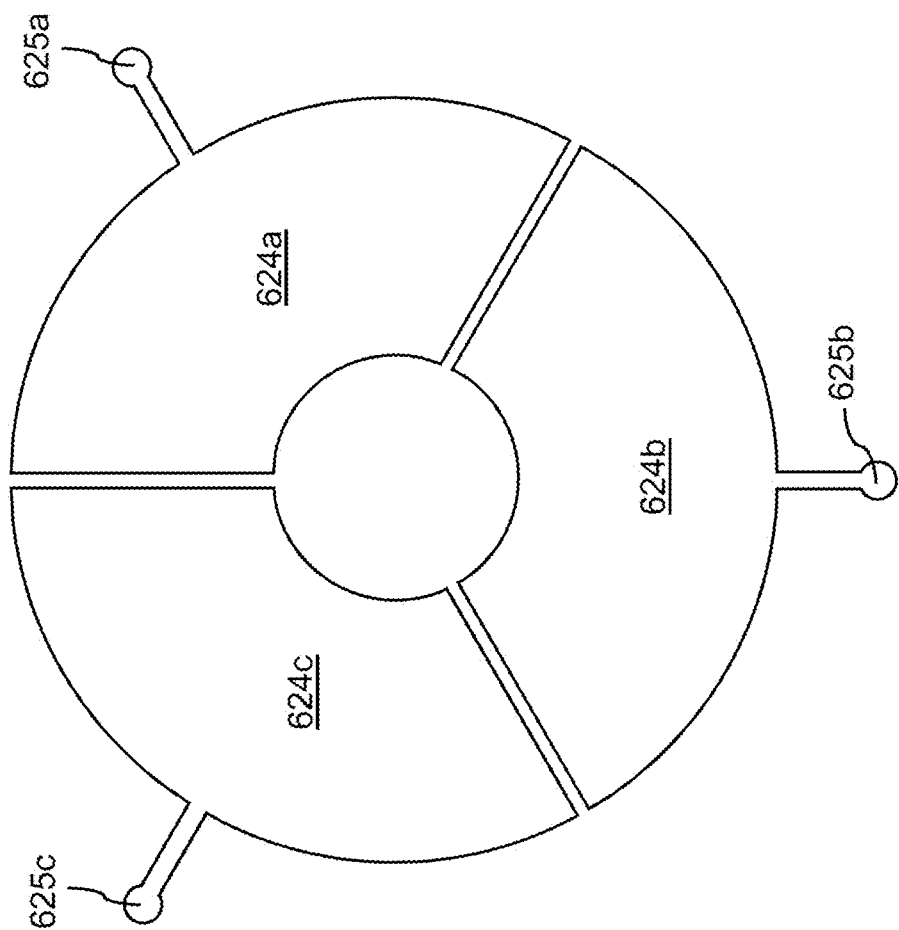
FIG. 9 is a view of a rear side of the piezoelectric membrane shown in FIG. 8.

As shown in FIG. 9, for the purpose of making a differential measurement scheme, as explained above, possible in association with each circumferential section 606a-c, it is possible to provide, for example, in each case a unitary reference electrode 624a-c on a rear side of the membrane 604, which electrodes can each be provided with a separate connection section 625a-c.

Figure 10:
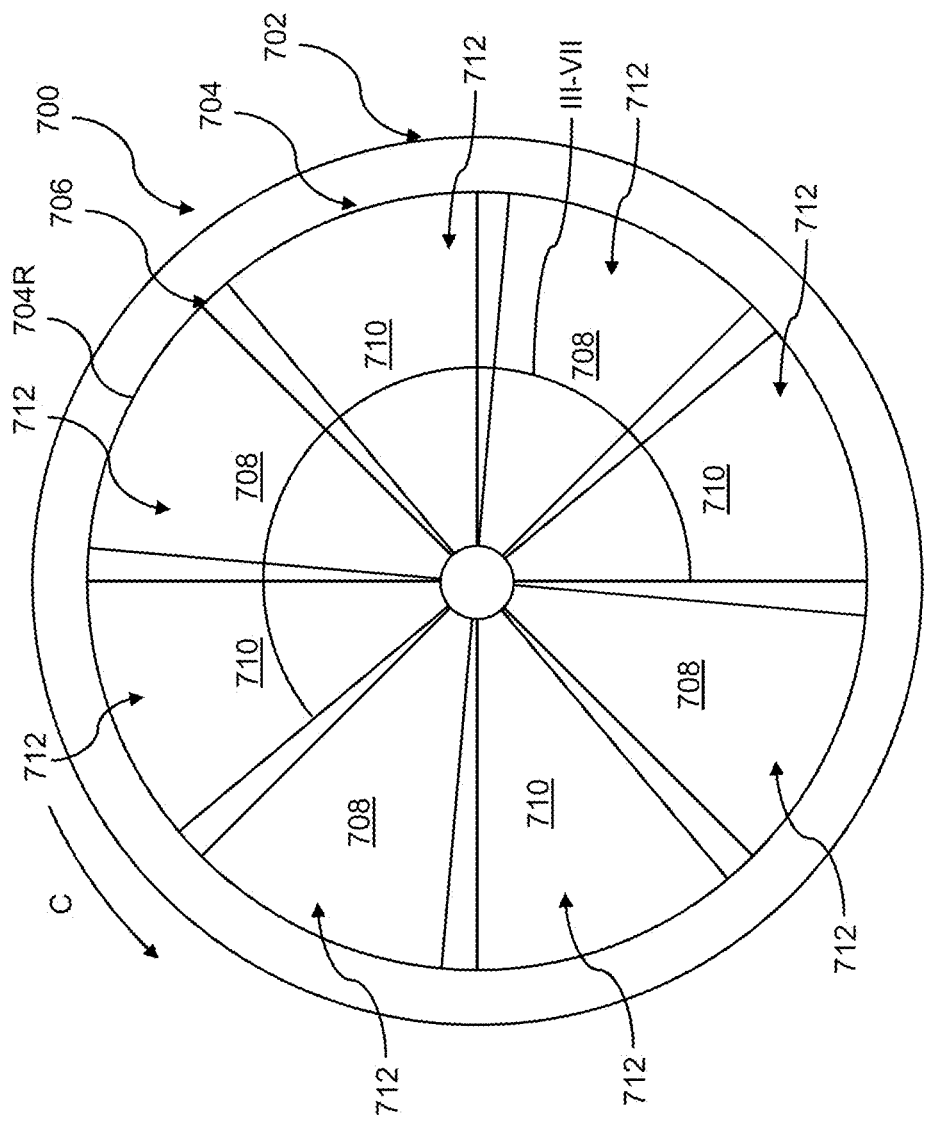
FIG. 10 is a plan view of a piezoelectric membrane of a microelectromechanical microphone according to a further exemplary embodiment.

FIG. 10 shows an exemplary microelectromechanical transducer 700 according to a further embodiment. The microelectromechanical transducer 700 has a membrane 704, which is secured to a holder 702 in an edge region 704R. The membrane 704 further has an undulated section 706, which has a plurality of undulation peaks 708 and a plurality of undulation troughs 710 at which in each case a piezoelectric unit cell 712 comprising a piezoelectric layer and at least one electrode can be provided. In contrast to the membrane 104 shown in FIG. 2, the undulation peaks 708 and the undulation troughs 710 have a substantially radial main extent. The undulation peaks 708 and the undulation troughs 710 are arranged consecutively in a circumferential direction C of the membrane 704 in alternating fashion. Moreover, the statements in connection with the embodiments shown in FIGS. 2 to 7 also apply to the transducer 700 shown in FIG. 10. This means, in particular, that the unit cells 712 provided in the undulation troughs 710 and at the undulation peaks 708 can be electrically interconnected with one another and formed as illustrated in FIGS. 3 to 7. The sectional illustrations of FIGS. 3 to 7 can thus be interpreted as sections through the transducer 700 shown in FIG. 10 along the line III-VII shown in FIG. 10.

The transducers 100-700 described here can be used, for example, in microphones, loudspeakers, acceleration sensors or in pressure sensors. An exemplary microelectromechanical microphone 800, in which an above-described transducer is incorporated, is described below with reference to FIG. 11. For the sake of simplicity, it is assumed here that said transducer is the transducer 100 shown in FIG. 2.

Figure 11:
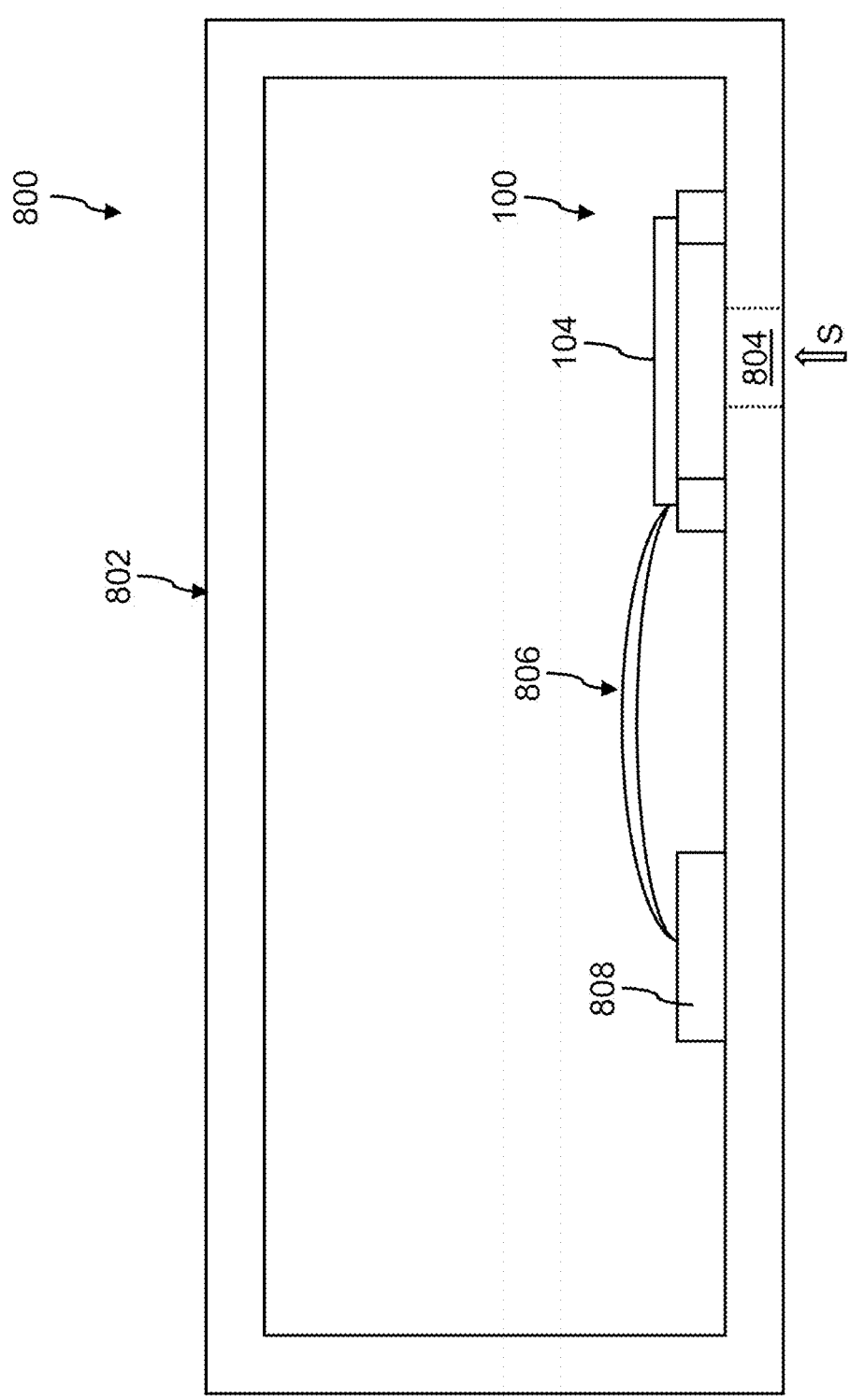
FIG. 11 is a schematic illustration of a microphone, which has a microelectromechanical transducer.

The microphone 800 can have a housing 802 comprising a sound entrance opening 804 in the interior of which the transducer 100 is incorporated. Sound waves S to be detected can enter the interior of the housing 802 through the sound entrance opening 804. As indicated in FIG. 11, the membrane 104 overlaps the sound entrance opening 804 so that sound waves S entering the interior of the housing 802 through the sound entrance opening 804 can impinge directly on the membrane 104. The transducer 100 can be set up to convert characteristics of the sound waves S to be detected, such as, for example, a sound frequency or a sound pressure, into electrical signals and to transmit said electrical signals to a control unit 808 via signal lines 806. The control unit 808 can evaluate the electrical signals received from the transducer 100 and ascertain characteristics of the sound waves S to be detected from said electrical signals. The control unit 808 can have, for example, a microprocessor or/and an application-specific integrated circuit (ASIC) or/and a field-programmable gate array (FPGA). A microelectromechanical microphone according to FIG. 11 can be incorporated, for example, into a mobile communication apparatus, such as, for example, a cell phone, a laptop or a tablet.

An exemplary method for producing a microelectromechanical transducer is described below with reference to FIGS. 12 to 17. For reasons of simplicity, only a part of a transducer that is to be produced is shown in these figures.

The method can comprise forming a negative mold 1000 for a membrane to be produced, which mold has a side 1001 comprising at least one undulation peak and at least one undulation trough, which side is complementary to a side of the membrane.

Figure 12:
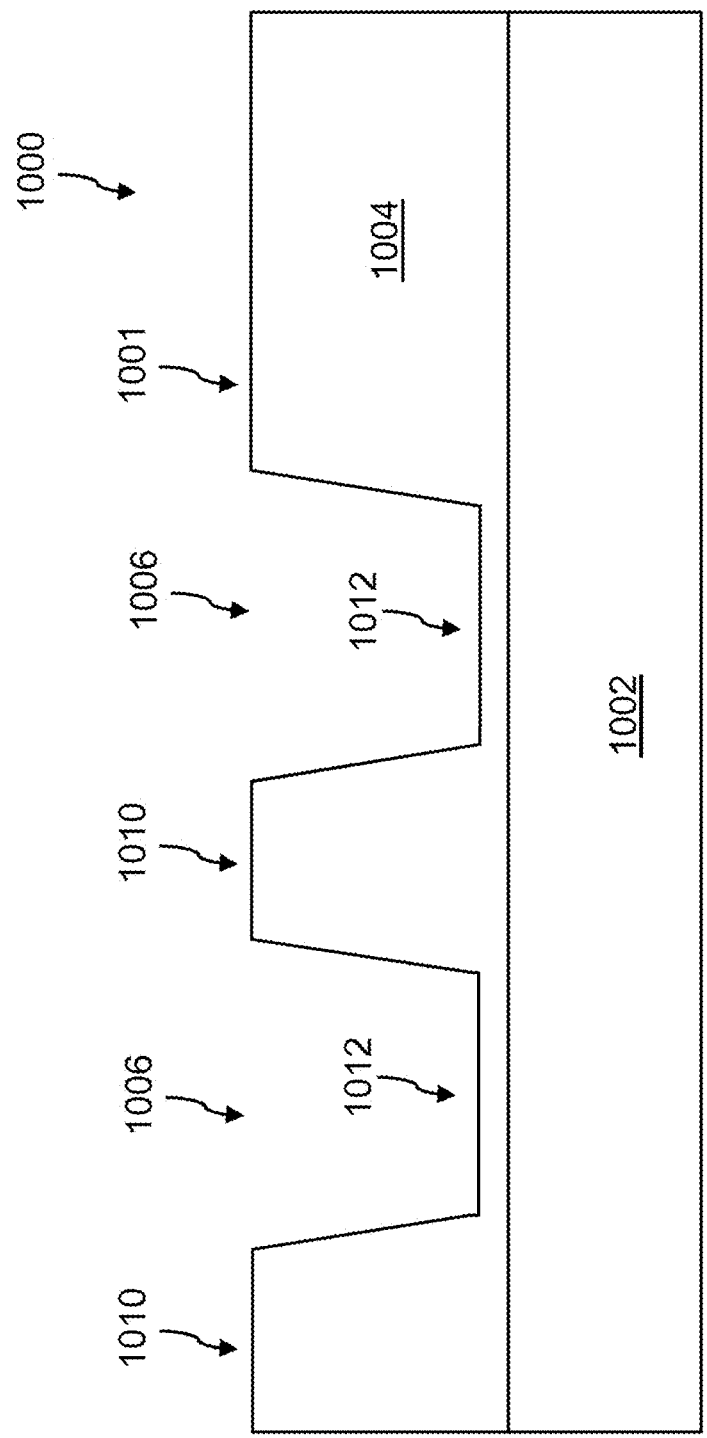
FIGS. 12 to 17 are schematic illustrations, which illustrate an exemplary method for producing an exemplary microelectromechanical transducer.

FIG. 12 illustrates the forming of a negative mold 1000 of this kind. In this case, a sacrificial material layer 1004, in which a plurality of recesses 1006 can be subsequently formed, can be deposited onto a substrate 1002. Alternatively, the plurality of recesses 1006 can be formed both in the sacrificial material layer 1004 and in the substrate 1002. As a result of this, a plurality of undulation peaks 1010 and a plurality of undulation troughs 1012 can be defined, which can have a substantially complementary design to an undulated section of a membrane that is to be produced. The substrate 1002 can be formed, for example, for a monocrystalline semiconductor material, such as monocrystalline silicon. The sacrificial layer 1004 can be formed, for example, from an oxide, such as $SiO_x$. The recesses 1006 can be formed, for example, by etching.

The depositing of the sacrificial material layer 1004 is optional. In an alternative exemplary method, a sacrificial material layer can be omitted. In such a case, at least one or a plurality of recesses for forming at least one undulation trough and at least one undulation peak can be formed only in the substrate 1002.

Figure 13:
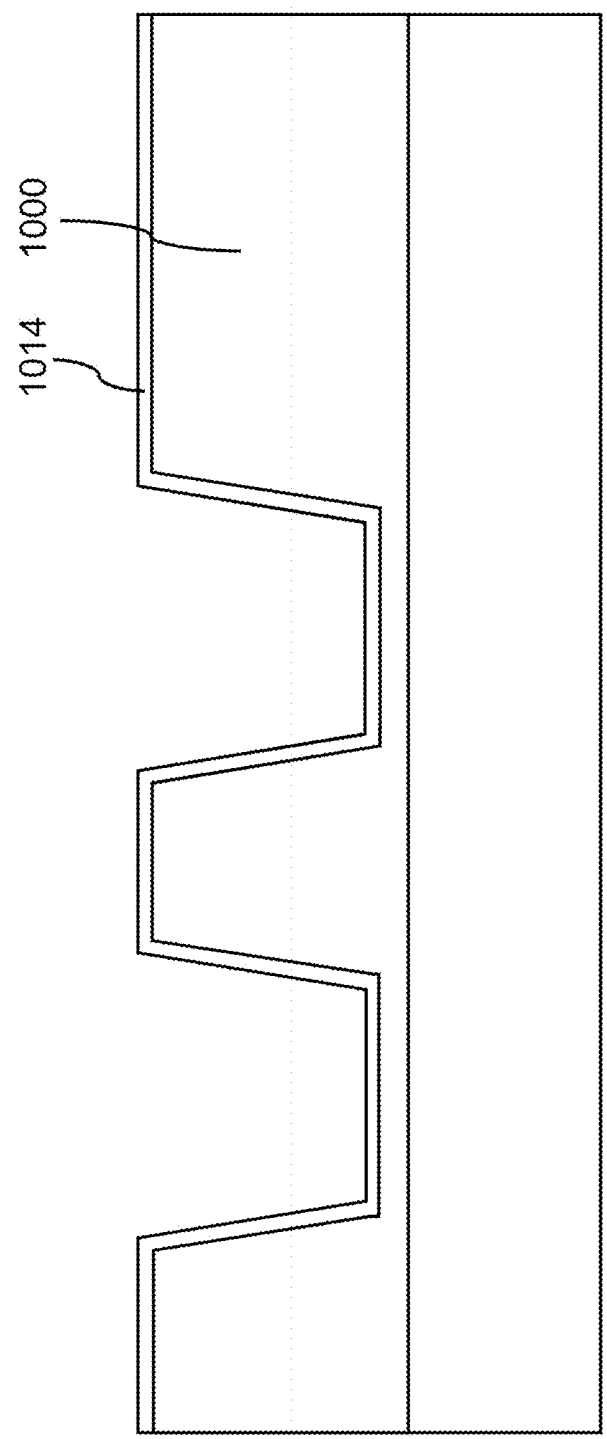

A membrane can subsequently be formed on the negative mold and a piezoelectric unit cell can be formed in each case in at least one of the undulation troughs 1012 and at least one of the undulation peaks 1010. To this end, as shown in FIG. 13, an electrically conductive layer 1014 can initially be deposited over a large area of the negative mold 1000, which electrically conductive layer also covers the sections of the negative mold 1000 that correspond to the undulation peaks 1010 and the undulation troughs 1012. The electrically conductive layer can be formed, for example, from a metal.

Figure 14:
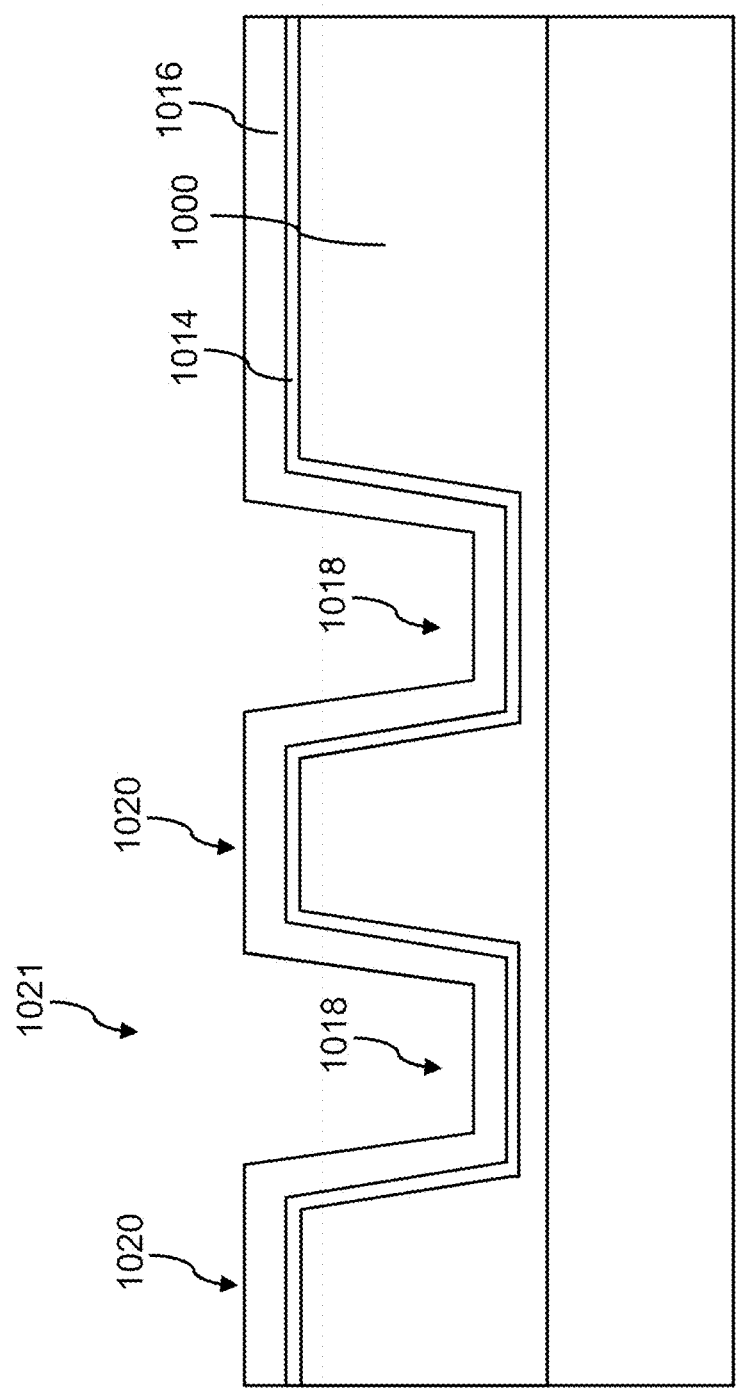
Figure 15:
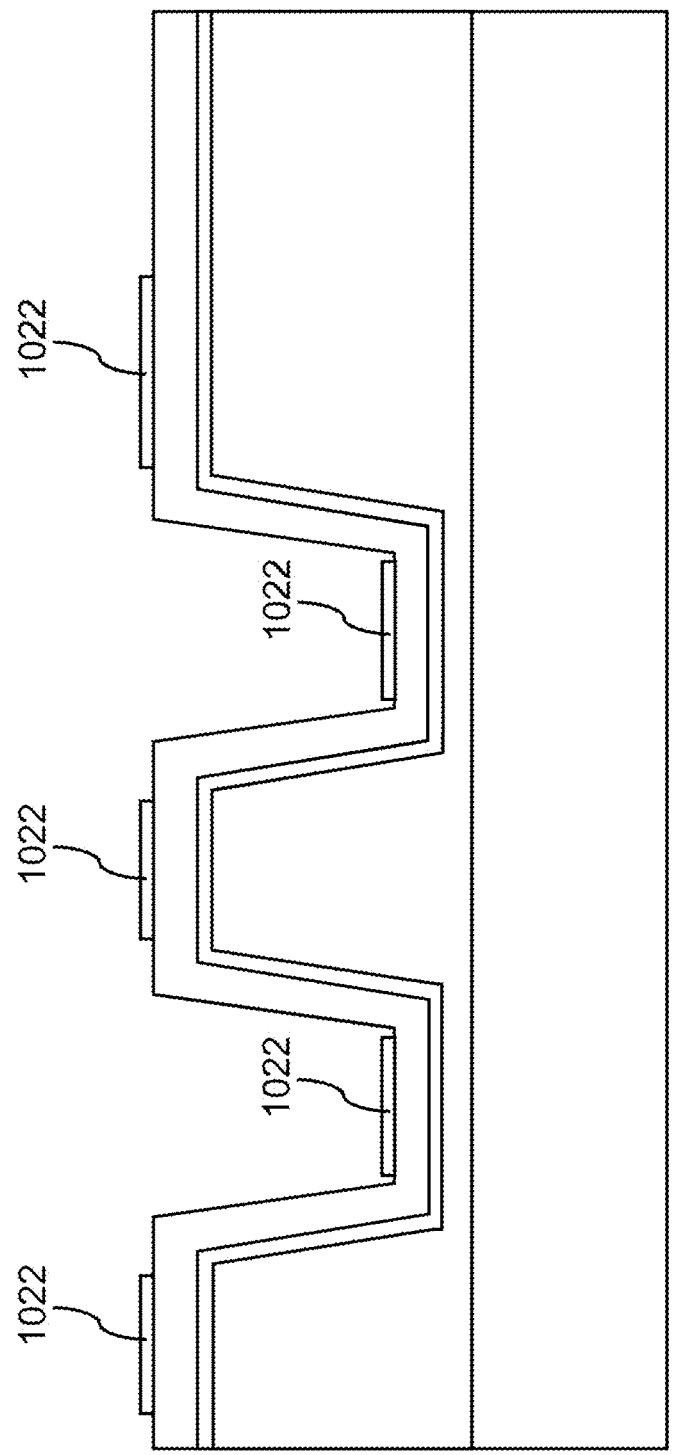

As shown in FIG. 14, a piezoelectric layer 1016 can subsequently be deposited onto the electrically conductive layer 1014, for example by sputtering, which piezoelectric layer itself defines a plurality of undulation troughs 1018 and a plurality of undulation peaks 1020. The electrically conductive layer 1014 consequently forms together with the piezoelectric layer 1016 a membrane 1021, which has a side complementary to the negative mold 1000.

After the forming of the membrane 1021, an electrode 1022 can be formed in each case in the undulation troughs 1018 and at the undulation peaks 1020, for example by depositing of a metal.

Figure 16:
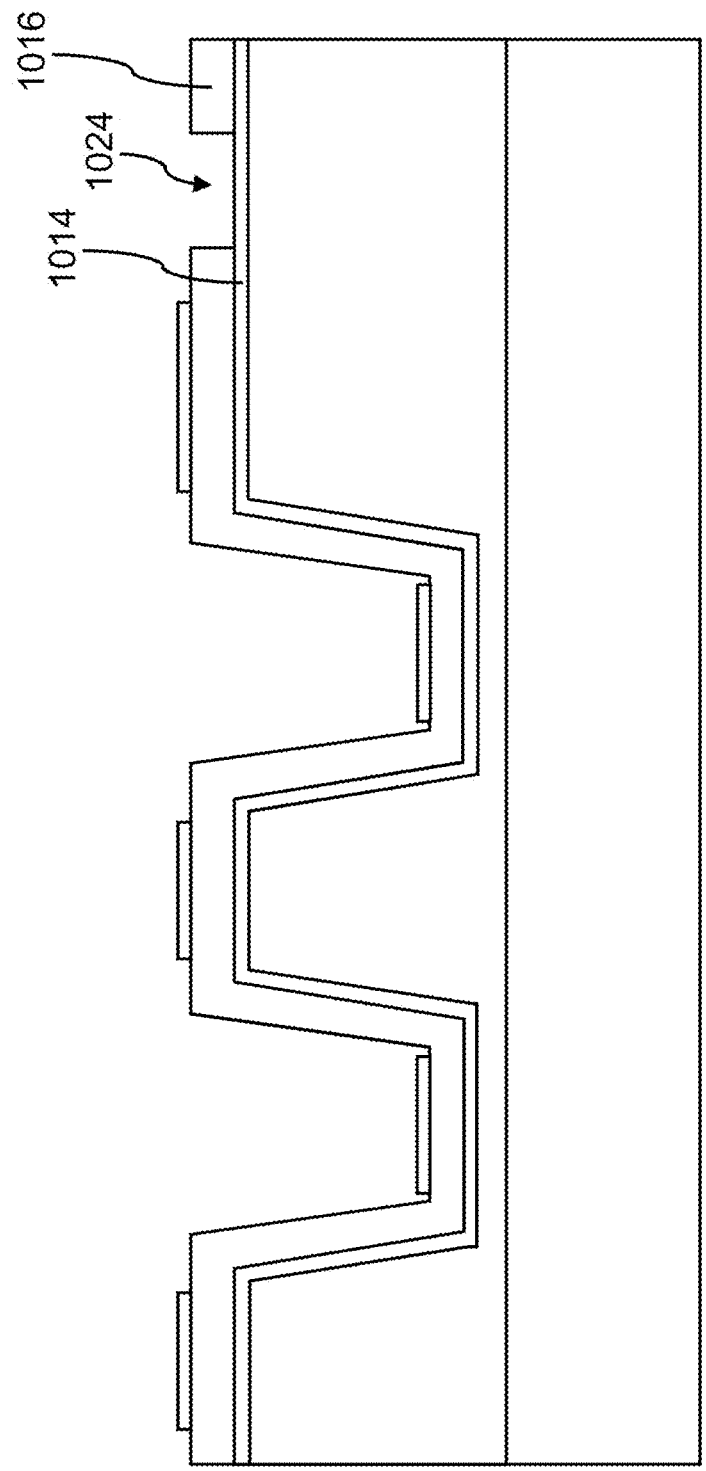
Figure 17:
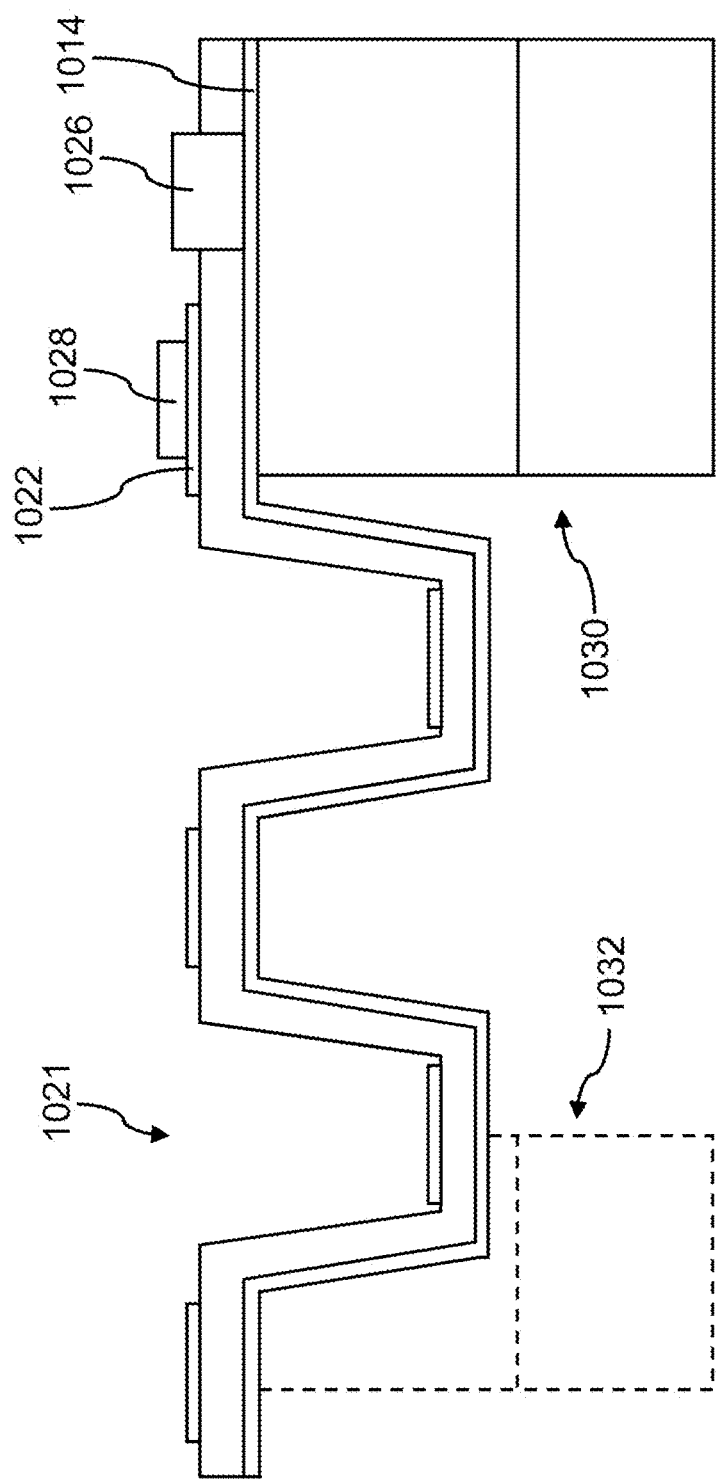

For the purpose of contacting the electrically conductive layer 1014, which can form a reference electrode, it is then possible, as shown in FIG. 16, to form an opening 1024 in the piezoelectric layer 1016, in which a contact pad 1026 for contacting the electrically conductive layer 1014, as shown in FIG. 17, can be formed. Further contact pads 1028 can also be formed at the electrodes 1022 formed on the piezoelectric layer 1016 in order to electrically contact said piezoelectric layer.

As further shown in FIG. 17, a part of the substrate 1002 and a part of the sacrificial layer 1004 can subsequently be removed in order to form a holder 1030 and in order to expose the membrane 1021. The transducer formed according to this method essentially has a structure according to FIG. 4.

During removal of a part of the sacrificial layer 1004 and a part of the substrate 1002, an inertial mass described with reference to FIG. 2 can also be formed by virtue of the sacrificial layer 1004 and the substrate 1002 in a region of the membrane 1021 other than an edge region not being removed. An inertial mass 1032 formed in this way is illustrated in FIG. 17 using dashes. In the exemplary illustration according to FIG. 17, the inertial mass 1032 is provided on an undulated section of the membrane 1021. Said inertial mass can of course be provided in a central region of the membrane 1021, which central region is not undulated in a similar manner to FIG. 2. FIG. 17 shows only a section of the membrane 1021, which has an undulated section and a region connected to the holder 1030. For reasons of simplicity, an inertial mass provided at a non-undulated central section of the membrane 1021 is therefore not shown here.

If, as mentioned above, a sacrificial material layer is omitted, only one part of the substrate can be removed to form a holder or/and an inertial mass.

The method described above can be easily modified in order to produce the other embodiments described here. If, for example, the electrically conductive layer 1016 is omitted, the membrane 104 shown in FIG. 3 can be produced. If the electrically conductive layer 1014 is structured in association with the undulation troughs and the undulation peaks to form a plurality of electrodes before the deposition of the piezoelectric layer 1016, the embodiment shown in FIG. 5 can be produced, for example.

Figure 18:
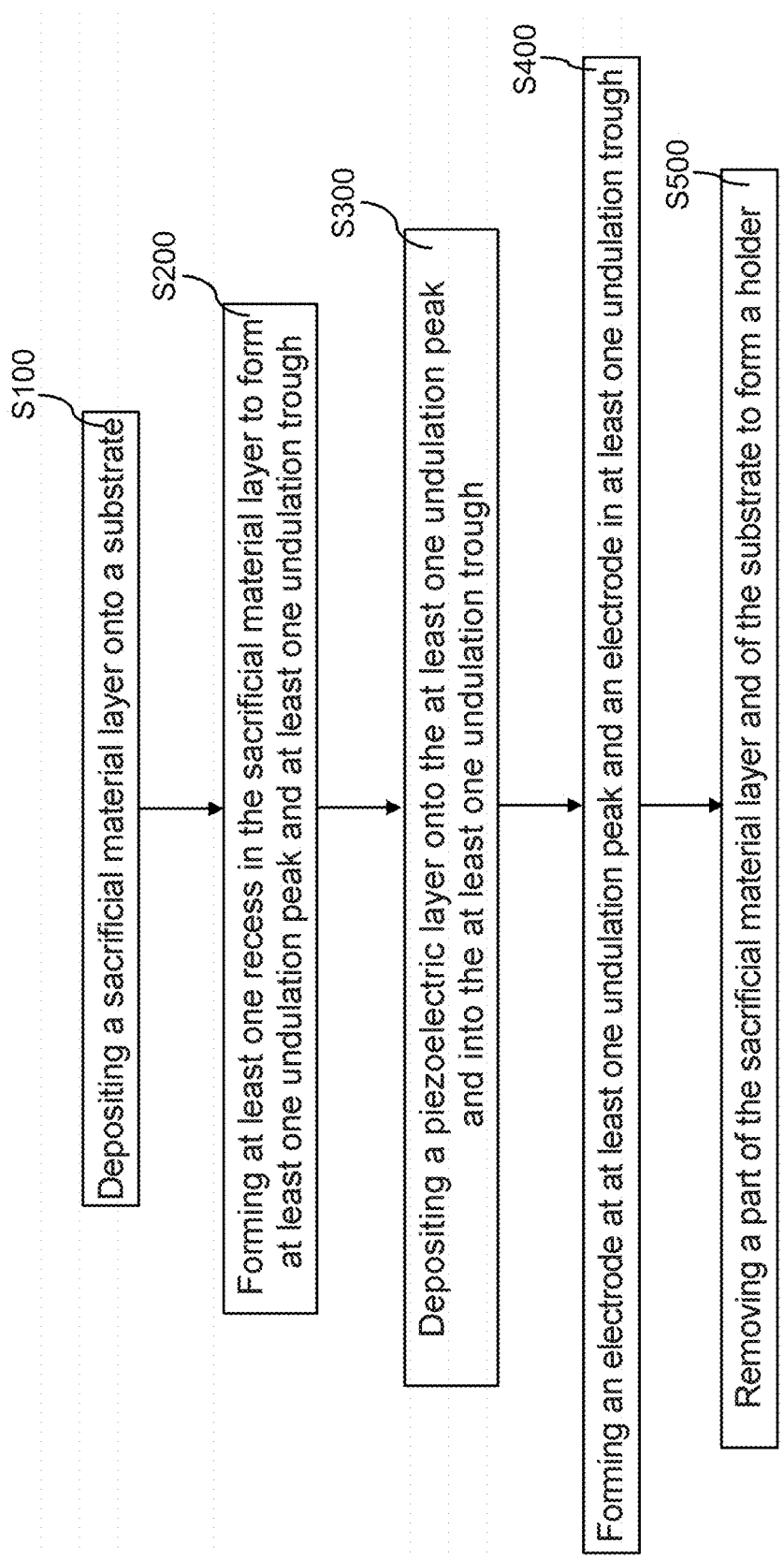
FIG. 18 is a flow chart of an exemplary method for producing an exemplary microelectromechanical transducer.

FIG. 18 shows a flow chart of an exemplary method for producing an exemplary microelectromechanical transducer. Said method can comprise: depositing a sacrificial material layer on a substrate (S100), forming at least one recess in the sacrificial material layer to form at least one undulation peak and at least one undulation trough (S200), depositing a piezoelectric layer at the at least one undulation peak and in the at least one undulation trough (S300), forming an electrode at least one undulation peak and an electrode in at least one undulation trough (S400), removing a part of the sacrificial material layer and of the substrate to form a holder (S500).

As mentioned above, the depositing of a sacrificial material layer onto the substrate can be omitted, wherein the at least one recess is then to be formed in the substrate.

Numerous exemplary embodiments are described below according to the present disclosure.

Example 1 is a microelectromechanical transducer, having a displaceable membrane, which has an undulated section comprising at least one undulation trough and at least one undulation peak, wherein a piezoelectric unit cell is provided in each case in at least one undulation trough and at least one undulation peak, wherein each piezoelectric unit cell has a piezoelectric layer and at least one electrode in electrical contact with the piezoelectric layer. The membrane can be formed as a planar component, which has a substantially larger extent in a first and a second spatial direction, which are orthogonal to one another, than in a third spatial direction, which is orthogonal to the first and the second spatial direction and defines an axial direction of the membrane. The at least one undulation peak and the at least one undulation trough can be provided consecutively in a radial direction or in a circumferential direction of the membrane.

In example 2, the subject matter of example 1 can optionally further comprise the undulated section having a plurality of undulation peaks or/and a plurality of undulation troughs.

In example 3, the subject matter of example 1 or 2 optionally further comprise at least one piezoelectric unit cell having an electrode on just one side of its piezoelectric layer, wherein a plurality of piezoelectric unit cells optionally have an electrode on just one side of their respective piezoelectric layers, wherein the electrodes of different piezoelectric unit cells are formed separately from one another.

In example 4, the subject matter of one of examples 1 to 3 can optionally further comprise at least one piezoelectric unit cell having electrodes on mutually opposite sides of its piezoelectric layer.

In example 5, the subject matter of example 4 can optionally further comprise a plurality of piezoelectric unit cells having electrodes on mutually opposite sides of their piezoelectric layers, wherein the electrodes of the plurality of piezoelectric unit cells on a first side of the piezoelectric layers are formed separately from one another and the electrodes of the plurality of piezoelectric unit cells on a second side of the piezoelectric layers, which is opposite the first side, are formed integrally with one another.

In example 6, the subject matter of example 4 or 5 can optionally further comprise at least one piezoelectric unit cell having electrodes on mutually opposite sides of its piezoelectric layer, which electrodes are in each case formed separately from electrodes of each other piezoelectric unit cell.

In example 7, the subject matter of example 2 and one of examples 3 to 6 can optionally further comprise a piezoelectric unit cell being provided in each case at a plurality of undulation peaks, wherein a plurality of the or all of the unit cells provided at the plurality of undulation peaks have in each case electrodes on the same side of their piezoelectric layers, which electrodes are formed separately from one another and are electrically connected in parallel with one another or/and wherein a piezoelectric unit cell is provided in each case in a plurality of undulation troughs, wherein a plurality of the or all of the unit cells provided in the plurality of undulation troughs have in each case electrodes on the same side of their piezoelectric layers, which electrodes are formed separately from one another and are electrically connected in parallel with one another.

In example 8, the subject matter of example 7 can optionally further comprise a plurality of the electrodes connected electrically in parallel and provided at the undulation peaks and a plurality of the electrodes connected electrically in parallel and provided in the undulation troughs, wherein the electrodes provided at the undulation peaks and connected electrically in parallel with one another are electrically connected in series with the electrodes provided in the undulation troughs and connected electrically in parallel with one another.

In example 9, the subject matter of example 8 can optionally further comprise the plurality of the undulation peaks at which the plurality of the electrodes electrically connected in parallel with one another are provided being arranged consecutively in the radial direction of the membrane, wherein the plurality of the undulation troughs in which the plurality of the electrodes electrically connected in parallel with one another are provided are arranged consecutively in the radial direction of the membrane, wherein the electrodes connected in parallel and provided at the plurality of the undulation peaks and the electrodes connected in parallel and provided in the plurality of the undulation troughs, which electrodes are electrically connected in series with one another, are optionally offset with respect to one another in the circumferential direction of the membrane, optionally in a manner free from overlapping.

In example 10, the subject matter of example 9 can optionally further comprise a connecting electrode that extends in the radial direction being provided in the circumferential direction between the electrodes provided at the plurality of the undulation peaks and connected in parallel and the electrodes provided in the plurality of the undulation troughs and connected in parallel, by means of which connecting electrode the electrodes provided at the plurality of the undulation peaks and connected in parallel are electrically connected in series with the electrodes provided in the plurality of the undulation troughs and connected in parallel.

In example 11, the subject matter of example 5 and either of examples 9 and 10 can optionally further comprise the piezoelectric unit cells corresponding to the plurality of the electrodes provided at the undulation peaks and electrically connected in parallel with one another having a common first reference electrode at a side of the respective piezoelectric layers that faces away from the electrodes connected in parallel and the piezoelectric unit cells corresponding to the plurality of the electrodes provided in the undulation troughs and electrically connected in parallel with one another having a common second reference electrode at a side of the respective piezoelectric layers that faces away from the electrodes connected in parallel, wherein the first reference electrode and the second reference electrode are formed separately from one another and are arranged offset with respect to one another in the circumferential direction of the membrane, optionally in a manner free from overlapping.

In example 12, the subject matter of one of examples 1 to 11 can optionally further comprise the piezoelectric layers of a plurality of piezoelectric unit cells being formed integrally with one another.

In example 13, the subject matter of one of examples 1 to 12 can optionally further comprise the piezoelectric layers of a plurality of piezoelectric unit cells being formed separately from one another.

In example 14, the subject matter of one of examples 1 to 13 can optionally further comprise the undulated section having an undulated carrier that is different from the piezoelectric unit cells, wherein the carrier is optionally formed from a non-piezoelectric material.

In example 15, the subject matter of one of examples 1 to 14 can optionally further comprise at least one undulation peak and at least one undulation trough having a substantially circular or circular-segment-shaped design and being optionally concentric.

In example 16, the subject matter of example 2 and one of examples 3 to 15 can optionally further comprise a plurality of undulation peaks and a plurality of undulation troughs, which are provided consecutively in the radial direction of the membrane in alternating fashion.

In example 17, the subject matter of examples 15 and 16 can optionally further comprise the plurality of undulation troughs or/and the plurality of undulation peaks having a substantially circular or circular-segment-shaped design and being optionally concentric.

In example 18, the subject matter of example 2 and one of examples 3 to 17 can optionally further comprise a plurality of undulation peaks and a plurality of undulation troughs, which have in each case a substantially radial main extent and are provided consecutively in the circumferential direction of the membrane in alternating fashion.

In example 19, the subject matter of one of examples 1 to 18 can optionally further comprise the membrane being formed as a closed component, which is free of fluid passage openings.

Example 20 is a microelectromechanical pressure sensor, having a microelectromechanical transducer according to one of examples 1 to 19.

Example 21 is a microelectromechanical acceleration sensor, having a microelectromechanical transducer according to one of examples 1 to 19, wherein an inertial mass is optionally provided on the membrane of the transducer, which inertial mass is further optionally formed separately from the membrane.

Example 22 is a microelectromechanical microphone, having a microelectromechanical transducer according to one of examples 1 to 19.

Example 23 is a microelectromechanical loudspeaker, having a microelectromechanical transducer according to one of examples 1 to 19.

Example 24 is a method for producing a microelectromechanical transducer according to one of examples 1 to 19, comprising: forming a negative mold for the membrane, which mold has a side comprising at least one undulation peak and at least one undulation trough, which side is complementary to a side of the membrane, forming the membrane on the side of the negative mold which has at least one undulation peak and at least one undulation trough, and forming a piezoelectric unit cell at least one undulation peak of the membrane and a piezoelectric unit cell in at least one undulation trough of the membrane.

In example 25, the subject matter of example 24 can optionally further comprise the forming of the negative mold comprising: forming the at least one undulation trough of the negative mold and the at least one undulation peak of the negative mold in a substrate, optionally: depositing a sacrificial material layer onto a substrate and forming the at least one undulation trough of the negative mold and the at least one undulation peak of the negative mold in the sacrificial material layer or in the sacrificial material layer and the substrate.

In example 26, the subject matter of example 25 can optionally further comprise the forming of the at least one undulation trough of the negative mold and the at least one undulation peak of the negative mold comprising forming at least one recess in the substrate or/and in the sacrificial material layer.

In example 27, the subject matter of one of examples 24 to 26 can optionally further comprise the forming of the membrane comprising: depositing a layer of a piezoelectric or/and a non-piezoelectric material onto the negative mold.

In example 28, the subject matter of one of examples 24 to 27 can optionally further comprise the forming of the piezoelectric unit cells comprising: depositing a layer of a piezoelectric material onto the at least one undulation peak of the negative mold or the membrane and depositing a layer of a piezoelectric material into the at least one undulation trough of the negative mold or the membrane, wherein the piezoelectric layers of a plurality of piezoelectric unit cells are formed integrally with one another or separately from one another.

In example 29, the subject matter of example 28 can optionally further comprise the forming of the piezoelectric unit cells further comprising: depositing an electrically conductive layer onto the at least one undulation peak of the negative mold or the membrane and depositing an electrically conductive layer into the at least one undulation trough of the negative mold or the membrane, wherein the electrically conductive layers of a plurality of piezoelectric unit cells are formed integrally with one another or separately from one another.

In example 30, the subject matter of one of examples 24 to 29 can optionally further comprise: removing a part of the negative mold for forming a holder that bears the membrane.

What is claimed is:

1. A method for producing a microelectromechanical transducer, comprising:
   forming a negative mold for a displaceable membrane, which mold has a side comprising at least one undulation peak and at least one undulation trough, which side is complementary to a side of the membrane,
   forming the displaceable membrane on the side of the negative mold which has at least one undulation peak and at least one undulation trough, and
   forming a first piezoelectric unit cell of a plurality of piezoelectric unit cells in at least one undulation peak of the membrane and a second piezoelectric unit cell of the plurality of piezoelectric unit cells in at least one undulation trough of the membrane.

2. The method as claimed in claim 1, wherein the forming the negative mold comprises:
   forming the at least one undulation trough of the negative mold and the at least one undulation peak of the negative mold in a substrate,
   depositing a sacrificial material layer on the substrate and forming the at least one undulation trough of the negative mold and the at least one undulation peak of the negative mold in the sacrificial material layer or in the sacrificial material layer and the substrate.

3. The method as claimed in claim 2,
   wherein the forming of the at least one undulation trough of the negative mold and of the at least one undulation peak of the negative mold comprises forming at least one recess in the substrate or/and the sacrificial material layer.

4. The method as claimed in claim 1, wherein the forming of the membrane comprises:
   depositing a layer of a piezoelectric or/and a non-piezoelectric material onto the negative mold.

5. The method as claimed in claim 1,
   wherein forming the plurality of piezoelectric unit cells comprises: depositing a layer of a piezoelectric material onto the at least one undulation peak of the negative mold or the membrane and depositing a layer of the piezoelectric material into the at least one undulation trough of the negative mold or the membrane, wherein the piezoelectric layers of the plurality of piezoelectric unit cells are formed integrally with one another or separately from one another,
   wherein the forming of the piezoelectric unit cells further comprises depositing a first electrically conductive layer onto the at least one undulation peak of the negative mold or the membrane and depositing a second electrically conductive layer into the at least one undulation trough of the negative mold or the membrane, wherein the first electrically conductive layer and the second electrically conductive layer are formed integrally with one another or separately from one another.

6. The method as claimed in claim 1, further comprising removing a part of the negative mold for forming a holder that bears the membrane.

7. A method of producing microelectromechanical transducer, the method comprising:
   forming a displaceable membrane having an undulated section comprising at least one undulation trough and at least one undulation peak, wherein the at least one undulation peak and the at least one undulation trough are provided consecutively in a radial direction of the membrane, or wherein the at least one undulation peak and the at least one undulation trough are provided consecutively in a circumferential direction of the membrane; and
   forming a plurality of piezoelectric unit cells, wherein at least one piezoelectric unit cell of the plurality of piezoelectric unit cells is provided in each case in the at least one undulation trough and in the at least one undulation peak, and wherein each piezoelectric unit cell of the plurality of piezoelectric unit cells has a piezoelectric layer and at least one electrode in electrical contact with the piezoelectric layer,
   wherein forming the membrane comprises forming the membrane as a planar component, which has a substantially larger extent in a first and a second spatial direction orthogonal to one another, than in a third spatial direction, which is orthogonal to the first and the second spatial direction and defines an axial direction of the membrane.

8. The method as claimed in claim 7 wherein the undulated section has a plurality of undulation peaks or a plurality of undulation troughs.

9. The method as claimed in claim 8,
   wherein the at least one piezoelectric unit cell is formed to have an electrode on just one side of its piezoelectric layer, wherein the electrodes of different piezoelectric unit cells are formed separately from one another; and
   wherein a piezoelectric unit cell of the plurality of piezoelectric unit cells is formed in each case at the plurality of undulation peaks, wherein the piezoelectric unit cells formed at the plurality of undulation peaks have in each case electrodes on the same side of their piezoelectric layers, which electrodes are formed separately from one another and are electrically connected in parallel with one another or wherein a piezoelectric unit cell of the plurality of piezoelectric unit cells is formed in each case in the plurality of undulation troughs, and wherein a plurality of or all of the unit cells formed in the plurality of undulation troughs have in each case electrodes on the same side of their piezoelectric layers, which electrodes are formed separately from one another and are electrically connected in parallel with one another.

10. The method as claimed in claim 9, further comprising forming a plurality of the electrodes connected electrically in parallel at the undulation peaks and forming a plurality of the electrodes connected electrically in parallel in the undulation troughs, wherein the electrodes formed at the undulation peaks and connected electrically in parallel with one another are electrically connected in series with the electrodes formed in the undulation troughs and connected electrically in parallel with one another.

11. The method as claimed in claim 8,
   wherein the at least one piezoelectric unit cell is formed to have an electrode on just one side of its piezoelectric layer, wherein the electrodes of different piezoelectric unit cells are formed separately from one another, and
   wherein forming the displaceable membrane comprises forming the plurality of undulation peaks and the plurality of undulation troughs consecutively in the radial direction of the membrane in alternating fashion.

12. The method as claimed in claim 8
wherein the at least one piezoelectric unit cell is formed to have an electrode on just one side of its piezoelectric layer, wherein the electrodes of different piezoelectric unit cells are formed separately from one another, and forming the displaceable membrane comprises forming the plurality of undulation peaks and the plurality of undulation troughs, which have in each case a substantially radial main extent and are disposed consecutively in the circumferential direction of the membrane in alternating fashion.

13. The method as claimed in claim 7,
wherein the at least one piezoelectric unit cell is formed to have an electrode on just one side of its piezoelectric layer, wherein the electrodes of different piezoelectric unit cells are formed separately from one another.

14. The method as claimed in claim 7, wherein the undulated section is formed to have an undulated carrier that is different from the plurality of piezoelectric unit cells, wherein the carrier is formed from a non-piezoelectric material.

15. The method as claimed in claim 7, wherein the at least one undulation peak and the at least one undulation trough are formed to have a substantially circular or circular-segment-shaped design.

16. The method as claimed in claim 7, wherein the membrane is formed as a closed component, which is free of fluid passage openings.

17. A method of operating a microelectromechanical transducer comprising a displaceable membrane having an undulated section comprising at least one undulation trough and at least one undulation peak; a plurality of piezoelectric unit cells, wherein at least one piezoelectric unit cell of the plurality of piezoelectric unit cells is provided in each case in the at least one undulation trough and the at least one undulation peak, wherein each piezoelectric unit cell of the plurality of piezoelectric unit cells has a piezoelectric layer and at least one electrode in electrical contact with the piezoelectric layer, wherein the membrane is formed as a planar component, which has a substantially larger extent in a first and a second spatial direction, which are orthogonal to one another, than in a third spatial direction, which is orthogonal to the first and the second spatial direction and defines an axial direction of the membrane, wherein the at least one undulation peak and the at least one undulation trough are provided consecutively in a radial direction of the membrane; or wherein the at least one undulation peak and the at least one undulation trough are provided consecutively in a circumferential direction of the membrane, the method comprising:

transducing a motion of the membrane to a first electrical signal using a piezoelectric unit cell of the plurality of piezoelectric unit cells; or transducing a second electrical signal to the motion of the membrane using the piezoelectric unit cell of the plurality of piezoelectric unit cells.

18. The method of claim 17, further comprising applying a physical pressure to the membrane and measuring the first electrical signal.

19. The method of claim 18, wherein applying the physical pressure to the membrane comprises applying a sound pressure to the membrane.

20. The method of claim 17, further comprising applying the second electrical signal to the piezoelectric unit cell of the plurality of piezoelectric unit cells.

21. The method of claim 17, wherein the microelectromechanical transducer further comprises an inertial mass provided in the membrane.

22. The method of claim 1, further comprising providing an inertial mass on the membrane.

23. The method of claim 22, wherein the inertial mass is formed separately from the membrane.

24. The method of claim 7, further comprising providing an inertial mass on the membrane.

25. The method of claim 17, further comprising providing an inertial mass on the membrane.

26. A microelectromechanical transducer comprising:
a displaceable membrane having an undulated section comprising at least one undulation trough and at least one undulation peak, wherein the at least one undulation peak and the at least one undulation trough are provided consecutively in a radial direction of the membrane, or wherein the at least one undulation peak and the at least one undulation trough are provided consecutively in a circumferential direction of the membrane; and
a plurality of piezoelectric unit cells, wherein at least one piezoelectric unit cell of the plurality of piezoelectric unit cells is provided in each case in the at least one undulation trough and in the at least one undulation peak, wherein each piezoelectric unit cell of the plurality of piezoelectric unit cells has a piezoelectric layer and at least one electrode in electrical contact with the piezoelectric layer,
the membrane is formed as a planar component, which has a substantially larger extent in a first and a second spatial direction, which are orthogonal to one another, than in a third spatial direction, which is orthogonal to the first and the second spatial direction and defines an axial direction of the membrane.

27. The microelectromechanical transducer of claim 26, further comprising an inertial mass provided on the membrane.

* * * * *